(12) United States Patent
Burak et al.

(10) Patent No.: US 9,571,063 B2
(45) Date of Patent: Feb. 14, 2017

(54) ACOUSTIC RESONATOR DEVICE WITH STRUCTURES HAVING DIFFERENT APODIZED SHAPES

(71) Applicant: Avago Technologies General IP (Singapore) Pte. Ltd., Singapore (SG)

(72) Inventors: Dariusz Burak, Fort Collins, CO (US); John Choy, Westminster, CO (US); Chris Feng, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 66 days.

(21) Appl. No.: 14/526,035

(22) Filed: Oct. 28, 2014

(65) Prior Publication Data

US 2016/0118958 A1 Apr. 28, 2016

(51) Int. Cl.
*H03H 9/13* (2006.01)
*H03H 9/54* (2006.01)
*H03H 9/02* (2006.01)
*H03H 9/17* (2006.01)

(52) U.S. Cl.
CPC .......... *H03H 9/132* (2013.01); *H03H 9/02118* (2013.01); *H03H 9/02157* (2013.01); *H03H 9/177* (2013.01); *H03H 9/54* (2013.01)

(58) Field of Classification Search
CPC H03H 9/02118; H03H 9/02157; H03H 9/173; H03H 9/132; H03H 9/54; H03H 9/177
USPC .......................... 333/133, 187, 188; 310/312
See application file for complete search history.

(56) References Cited

U.S. PATENT DOCUMENTS

| | | |
|---|---|---|
| 5,587,620 A | 12/1996 | Ruby et al. |
| 5,873,153 A | 2/1999 | Ruby et al. |
| 6,107,721 A | 8/2000 | Lakin |
| 6,215,375 B1 * | 4/2001 | Larson, III ............ H03H 9/132 310/321 |
| 6,384,697 B1 | 5/2002 | Ruby |
| 6,507,983 B1 | 1/2003 | Ruby et al. |
| 6,548,943 B2 | 4/2003 | Kaitila et al. |

(Continued)

OTHER PUBLICATIONS

Puneet Kumar, "Design of a New Step-like Frame FBAR for Suppression of Spurious Resonances", Radioengineering, vol. 22, No. 3, Sep. 2013, pp. 687-693.

(Continued)

*Primary Examiner* — Robert Pascal
*Assistant Examiner* — Jorge Salazar, Jr.

(57) ABSTRACT

An acoustic resonator device includes a bottom electrode disposed on a substrate over an acoustic reflecting feature, a piezoelectric layer disposed on the bottom electrode and a top electrode disposed on the piezoelectric layer, where an overlap between the top electrode, the piezoelectric layer and the bottom electrode over the acoustic reflecting feature define an active region of the acoustic resonator device. The acoustic resonator device further includes at least one of a wing having an outer edge extending beyond at least a portion of an outer edge of the top electrode, and a first frame formed in one of an outer region or a center region of the top electrode. The at least one of the wing and the first frame has an apodized shape, such that no edges are parallel to one another, the apodized shape of the at least one of the wing and the first frame being different from an electrode shape defined by an outer edge of the top electrode.

20 Claims, 12 Drawing Sheets

(56) References Cited

U.S. PATENT DOCUMENTS

| | | |
|---|---|---|
| 7,275,292 B2 | 10/2007 | Ruby et al. |
| 7,280,007 B2 | 10/2007 | Feng et al. |
| 7,345,410 B2 | 3/2008 | Grannen et al. |
| 7,358,831 B2 | 4/2008 | Larson, III et al. |
| 7,388,454 B2 | 6/2008 | Ruby et al. |
| 7,629,865 B2 | 12/2009 | Ruby |
| 8,164,235 B2 | 4/2012 | Koyama |
| 2007/0205850 A1 | 9/2007 | Jamneala et al. |
| 2007/0279153 A1* | 12/2007 | Ruby ................ H03H 9/02118 333/189 |
| 2008/0258842 A1 | 10/2008 | Ruby et al. |
| 2010/0327697 A1 | 12/2010 | Choy et al. |
| 2010/0327994 A1 | 12/2010 | Choy et al. |
| 2011/0148547 A1* | 6/2011 | Zhang ................ H03H 9/02118 333/187 |
| 2012/0218057 A1 | 8/2012 | Burak et al. |
| 2013/0038408 A1 | 2/2013 | Burak et al. |
| 2013/0106534 A1 | 5/2013 | Burak et al. |
| 2013/0314177 A1 | 11/2013 | Burak et al. |
| 2014/0111288 A1 | 4/2014 | Nikkel et al. |
| 2014/0118087 A1 | 5/2014 | Burak et al. |
| 2014/0118088 A1 | 5/2014 | Burak et al. |
| 2014/0118089 A1 | 5/2014 | Bradley et al. |
| 2014/0118090 A1 | 5/2014 | Grannen et al. |
| 2014/0118091 A1 | 5/2014 | Burak et al. |
| 2014/0203686 A1 | 7/2014 | Song et al. |

OTHER PUBLICATIONS

Hosoo Park et al., "Advanced Lateral Structures of BAW Resonator for Spurious Mode Suppression", Proceedings of the 42nd European Microwave Conference, Oct. 29-Nov. 1, 2012, pp. 104-107.

* cited by examiner

ACOUSTIC RESONATOR DEVICE WITH STRUCTURES HAVING DIFFERENT APODIZED SHAPES

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), solidly mounted resonators (SMRs), coupled resonator filters (CRFs), stacked bulk acoustic resonators (SBARs), and double bulk acoustic resonators (DBARs). An FBAR, for example, includes a piezoelectric layer between a bottom (first) electrode and a top (second) electrode over a cavity. BAW resonators may be used in a wide variety of electronic applications, such as cellular telephones, personal digital assistants (PDAs), electronic gaming devices, laptop computers and other portable communications devices. For example, FBARs operating at frequencies close to their fundamental thickness extensional resonance frequencies may be used as a key component of radio frequency (RF) filters and duplexers in mobile devices.

An acoustic resonator typically comprises a layer of piezoelectric material sandwiched between two plate electrodes in a structure referred to as an acoustic stack. Where an input electrical signal is applied between the electrodes, reciprocal or inverse piezoelectric effect causes the acoustic stack to mechanically expand or contract depending on the polarization of the piezoelectric material. As the input electrical signal varies over time, expansion and contraction of the acoustic stack produces acoustic waves that propagate through the acoustic resonator in various directions and are converted into an output electrical signal by the piezoelectric effect. Some of the acoustic waves achieve resonance across the acoustic stack, with the resonant frequency being determined by factors such as the materials, dimensions, and operating conditions of the acoustic stack. These and other mechanical characteristics of the acoustic resonator determine its frequency response.

In general, an acoustic resonator comprises different lateral regions that may be subject to different types of resonances, or resonance modes. These lateral regions can be characterized, very broadly, as a main membrane region and peripheral regions, where the main membrane region is defined, roughly, by an overlap between the two plate electrodes and the piezoelectric material, and the peripheral regions are defined as areas outside the main membrane region. Two peripheral regions, in particular, are defined as a region located between the edge of the main membrane region and edge of the air cavity, and a region of an overlap of at least one plate electrode and the piezoelectric material with the substrate. The main membrane region is subject to electrically excited modes generated by the electric field between the two plate electrodes, and both the main membrane and the peripheral regions are subject to certain derivative modes generated by scattering of energy in the electrically excited modes. The electrically excited modes comprise, for instance, a piston mode formed by longitudinal acoustic waves with boundaries at the edges of the main membrane region. The derivative modes comprise, for instance, lateral modes formed by lateral acoustic waves excited at the edges of the main membrane region and the peripheral regions.

The lateral modes facilitate continuity of appropriate mechanical particle velocities and stresses between the electrically driven main membrane region and the essentially non-driven peripheral regions. They can either propagate freely (so called propagating modes) or exponentially decay (so called evanescent and complex modes) from the point of excitation. They can be excited both by lateral structural discontinuities (e.g., an interface between regions of different thicknesses in the main membrane region, or an edge of a top or bottom electrode) or by electric field discontinuities (e.g., an edge of a top electrode where the electric field is terminated abruptly).

The lateral modes generally have a deleterious impact on the performance of an acoustic resonator. Accordingly, some acoustic resonators include ancillary structural features designed to suppress, inhibit, or mitigate the lateral modes. For example, an air-ring (e.g., including air-bridges and/or air-wings) may be formed under the top electrode by an extended wing of the acoustic resonator in order to eliminate the transducer effect over the substrate. In another example, a frame may be formed by a conductive or dielectric material within the boundary of the main membrane region to minimize scattering of electrically excited piston mode at top electrode edges and improve confinement of mechanical motion to the main membrane region.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
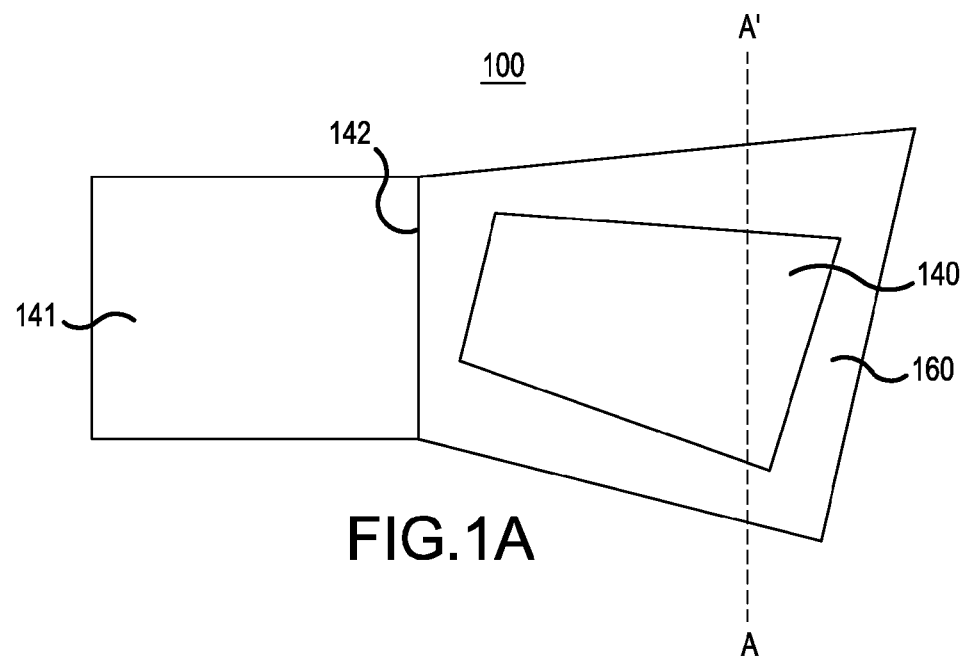
FIG. 1A is a top view of an acoustic resonator having a lateral performance enhancement feature with a different apodized shape, according to a representative embodiment.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

The present teachings relate generally to acoustic resonators, such as film bulk acoustic wave resonators (FBARs) and solidly mounted resonators (SMRs), for example. For simplicity of explanation, several embodiments are described in the context of FBAR technologies; however, the described concepts can be adapted for use in other types of acoustic resonators, including SMRs, for example. Certain details of acoustic resonators, including materials and methods of fabrication, may be found in one or more of the following commonly owned U.S. Patents and Patent Applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al. (issued as U.S. Pat. No. 8,981,876 on Mar. 17, 2015); U.S. Pat. No. 7,388,454 to Ruby et al.; U.S. patent application Ser. No. 13/658,024 to Nikkel et al. (published as U.S. Patent App. Pub. No. 2014/0111288 on Apr. 24, 2014, and issued as U.S. Pat. No. 9,385,684 on Jul. 5, 2016); U.S. patent application Ser. No. 13/955,774 to Burak et al. (published as U.S. Patent App. Pub. No. 2013/0314177 on Nov. 28, 2013, and issued as U.S. Pat. No. 9,246,473 on Jan. 26, 2016); U.S. patent application Ser. No. 13/663,449 to Burak et al. (published as U.S. Patent App. Pub. No. 2014/0118091 on May 1, 2014, and issued as U.S. Pat. No. 9,401,692 on Jul. 26, 2016); U.S. patent application Ser. No. 13/660,941 to Burak et al. (published as U.S. Patent App. Pub. No. 2014/0118088 on May 1, 2014, and issued as U.S. Pat. No. 9,425,764 on Aug. 23, 2016); U.S. patent application Ser. No. 13/654,718 to Burak et al. (issued as U.S. Pat. No. 9,099,983 on Aug. 4, 2015); U.S. Patent App. Pub. No. 2008/0258842 to Ruby et al. (issued as U.S. Pat. No. 7,714,684 on May 11, 2010); and U.S. Pat. No. 6,548,943 to Kaitila et al. The disclosures of these patents and patent applications are hereby specifically incorporated by reference in their entireties. It is emphasized that the components, materials and method of fabrication described in these patents and patent applications are representative and other methods of fabrication and materials within the purview of one of ordinary skill in the art are contemplated.

In a representative embodiment, an acoustic resonator device includes a bottom electrode disposed on a substrate over an acoustic reflecting feature, such as an air cavity or an acoustic mirror; a piezoelectric layer disposed on the bottom electrode; and a top electrode disposed on the piezoelectric layer. An overlap among the top electrode, the piezoelectric layer and the bottom electrode over the acoustic reflecting feature define a main membrane region of the acoustic resonator device. The acoustic resonator device also includes one or more lateral performance enhancement features, such as an inner frame, an outer frame and/or a wing (forming an air-ring over the piezoelectric layer). For example, one or both of an outer frame and an inner frame may be formed on the top electrode in an outer region and a center region of the main membrane region, respectively. The outer frame may be referred to as a first frame and the inner frame may be referred to as a second frame, or vice versa.

One or more of the top electrode and lateral performance enhancement features may have different shapes from one another, and at least one of the different shapes may be apodized, such that no edges of that shape are parallel to one another. For example, one or both of the outer frame and the inner frame may have an apodized frame shape, which may be different from an electrode shape (which may also be apodized) defined by outer edges of the top electrode. Similarly, the wing may be formed having outer edges extending beyond at least a portion of the outer edges of the top electrode, forming an air-ring. The wing may also have an apodized shape, which may be the same as or different from the (apodized) shapes of the outer frame, the inner frame and/or the top electrode.

The apodized shape(s) of the lateral performance enhancement feature(s), which are different from one another and/or different from the shape of the top electrode, further improve performance of the acoustic resonator device, as compared to merely adding the lateral performance enhancement feature(s), with or without apodized shapes that are the same as one another. For example, the different apodized shapes reduce or eliminate periodic patterns of Q versus width of the lateral performance enhancement feature(s), respectively, so as to reduce performance variation of the acoustic resonator device and to improve efficient manufacturability of high performance acoustic resonator devices. The different apodized shapes also enable increased acoustic resonator packing density, for example, in RF filter devices. This is because the acoustic resonator devices (e.g., FBARs or SMRs) are able to have more conventional shapes, such as squares and rectangles, that accommodate close packing arrangements, while the benefits of apodization may still be realized by including lateral performance enhancement feature(s) with apodized shapes.

Generally, in various representative embodiments described below, an acoustic resonator comprises an acoustic stack formed by a piezoelectric layer disposed between top and bottom electrodes, disposed on a substrate over an air cavity, a distributed Bragg reflector (DBR) or other acoustic reflector. An overlap between a portion of the top electrode, the piezoelectric layer and the bottom electrode over the acoustic reflector cavity defines a main membrane region. Outer frames may be formed on the top electrode, defining an active region within the main membrane region. In addition, an inner frame may be formed by depositing additional material in a center region of the top electrode (main part of the acoustic resonator), and/or an air-ring may be formed outside an outer boundary of the main membrane region. The air-ring may be formed between the piezoelectric layer and the top electrode, such that it comprises an air-bridge on the connection side of the top electrode and an air-wing along the remaining outside perimeter.

A frame may be formed by adding a layer of material, usually an electrically conducting material (although dielectric material is possible as well), to the top electrode and/or the bottom electrode. The frame can be either a composite frame or an add-on frame. In the embodiments depicted herein, the frames are shown as add-on frames, for the sake of convenience, although composite frames may be included instead without departing from the scope of the present teachings. Examples of construction of various composite and add-on frames are provided by U.S. patent application Ser. No. 13/781,491 to Burak et al. (published as U.S. Patent App. Pub. No. 2014/0118087 on May 1, 2014, and issued as U.S. Pat. No. 9,490,771 on Nov. 8, 2016), which is hereby incorporated by reference in its entirety.

A frame generally suppresses electrically excited piston mode in the frame region, and it reflects and otherwise resonantly suppresses propagating eigenmodes in lateral directions, with both effects simultaneously improving operation of the acoustic resonator. This is because the frame's presence generally produces at least one of a cutoff frequency mismatch and an acoustic impedance mismatch between the frame region and other portions of the active region. A frame that lowers the cutoff frequency in the frame region as compared to the active region may be referred to as a Low Velocity Frame (LVF), while a frame that increases the cutoff frequency in the frame region as compared to the main active region may be referred to as a High Velocity Frame (HVF).

A frame with lower effective sound velocity than the corresponding effective sound velocity of the active region (i.e., an LVF) generally increases parallel resistance Rp and Q-factor of the acoustic resonator above the cutoff frequency of the active region. Conversely, a frame with a higher effective sound velocity than the corresponding effective sound velocity of the active region (i.e., an HVF) generally decreases series resistance Rs and increases Q-factor of the acoustic resonator below the cutoff frequency of the main active region. A typical low velocity frame, for example, effectively provides a region with significantly lower cutoff frequency than the active region and therefore minimizes the amplitude of the electrically excited piston mode towards the edge of the top electrode in the frame region. Furthermore, it provides two interfaces (impedance miss-match planes), which increase reflection of propagating eigenmodes. These propagating eigenmodes are mechanically excited at active/frame interface, and both mechanically and electrically excited at the top electrode edge. Where the width of the frame is properly designed for a given eigenmode, it results in resonantly enhanced suppression of that particular eigenmode. In addition, a sufficiently wide low velocity frame provides a region for smooth decay of the evanescent and complex modes, which are excited by similar mechanisms as the propagating eigenmodes. The combination of the above effects yields better energy confinement and higher Q-factor at a parallel resonance frequency Fp.

Various additional examples of frames, as well as related materials and operating characteristics, are described in the above cited U.S. patent application Ser. Nos. 13/663,449 (issued as U.S. Pat. No. 9,401,692 on Jul. 26, 2016) and 13/660,941 (issued as U.S. Pat. No. 9,425,764 on Aug. 23, 2016) to Burak et al., which are hereby incorporated by reference in their entireties. As explained in those applications, frames can be placed in various alternative locations and configurations relative to other portions of an acoustic resonator, such as the electrodes and piezoelectric layer of an acoustic stack. Additionally, their dimensions, materials, relative positioning, and so on, can be adjusted to achieve specific design objectives, such as a target resonance frequency, series resistance Rs, parallel resistance Rp, or electromechanical coupling coefficient $Kt^2$. Although the following description presents several embodiments in the form of FBAR and SMR devices, several of the described concepts could be implemented in other forms of acoustic resonators.

Figure 1B:
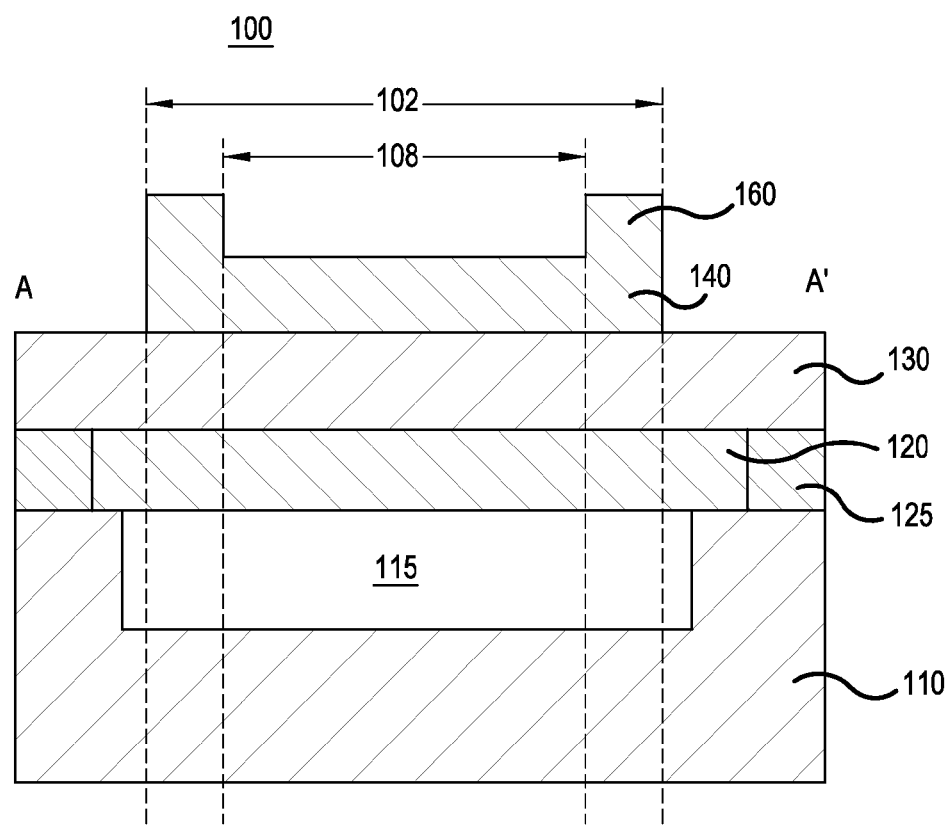
FIG. 1B is a cross-sectional view of a thin film bulk acoustic resonator (FBAR), according to a representative embodiment.

FIG. 1A is a top view of an acoustic resonator according to a representative embodiment, and FIG. 1B is a cross-sectional view of the acoustic resonator, taken along a line A-A' in FIG. 1A, according to a representative embodiment.

More particularly, FIGS. 1A and 1B depict an acoustic resonator 100, which is an FBAR, for purposes of illustration. The acoustic resonator 100 includes a substrate 110 defining an air cavity 115, a bottom (first) electrode 120 disposed on the substrate 110 and air cavity 115, a planarization layer 125 disposed adjacent to bottom electrode 120 on the substrate 110, a piezoelectric layer 130 disposed on the bottom electrode 120 and the planarization layer 125, and a top (second) electrode 140 disposed on the piezoelectric layer 130. Collectively, the bottom electrode 120, the piezoelectric layer 130, and the top electrode 140 constitute an acoustic stack of the acoustic resonator 100. Also, an overlap among the bottom electrode 120, the piezoelectric layer 130 and the top electrode 140 over the air cavity 115 defines a main membrane region 102 of the acoustic resonator 100. Dotted vertical lines indicate the boundary of the main membrane region 102.

The acoustic resonator 100 further includes a representative lateral performance enhancement feature, indicated as outer frame 160 formed on an outer region of the top electrode 140 (e.g., around an outer perimeter of the top electrode 140). The outer frame 160 has inner edges that define a boundary of an active region 108 formed within the main membrane region 102. The outer edges of the outer frame 160 may coincide with the outer edges of the bottom electrode 120. Although not shown, a passivation layer may be present on top of top electrode 140 and the outer frame 160 (in each embodiment discussed herein) with a thickness sufficient to insulate all layers of the acoustic stack from the environment, including protection from moisture, corrosives, contaminants, debris and the like.

In the depicted embodiment, each of the top electrode 140 and the outer frame 160 has an apodized shape. Apodized means that no two sides of the shape are parallel to one another. In the example shown in FIG. 1A, each of the apodized shapes is a polygon shape, meaning that it is formed of straight line segments (or edges) joined at vertices (or corners) to form a closed figure. More particularly, the apodized shapes in FIG. 1A are quadrilateral shapes since they have four sides. However, in alternative embodiments, any other polygon shapes, such as a triangle (three sides), a pentagon (five sides), or a hexagon (six sides), etc., may be incorporated without departing from the scope of the present teachings. The top electrode 140 also has a connection side 141 configured to provide an electrical connection to interconnect 142. The interconnect 142 provides electrical signals to top electrode 140 to excite desired acoustic waves in the piezoelectric layer 130 of the acoustic resonator 100.

The apodized shapes of the top electrode 140 and the outer frame 160 are different from one another. For purposes of illustration, the shape of the top electrode 140 may be referred to as a primary apodization (or reference apodization) and the shape of the outer frame 160 may be referred to as a secondary apodization, although these labels may be reversed. The apodized shape of the top electrode 140 is formed by the corresponding shape of the outer perimeter, while the apodized shape of the outer frame is formed by both the corresponding shape of the outer perimeter (which aligns with the outer perimeter of the top electrode 140 in the present example) and the corresponding shape of the inner perimeter. As shown, the shape formed by the four sides of the inner perimeter of the outer frame 160 differ from the shape formed by the four sides of the outer perimeters of the outer frame 160 and the top electrode 140, thus providing the secondary apodization.

Figure 1C:
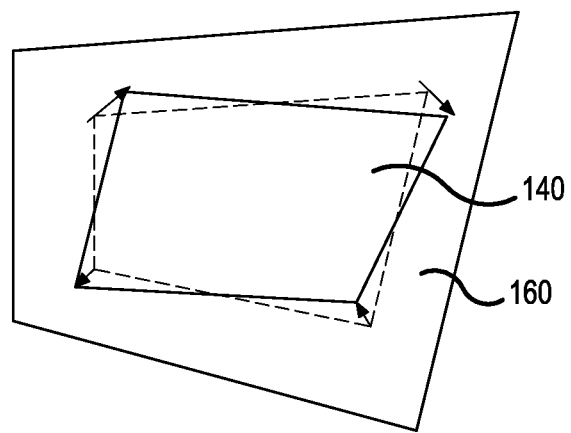
FIG. 1C is a top view of an acoustic resonator showing translational secondary apodization of a lateral performance enhancement feature, according to a representative embodiment.
Figure 1D:
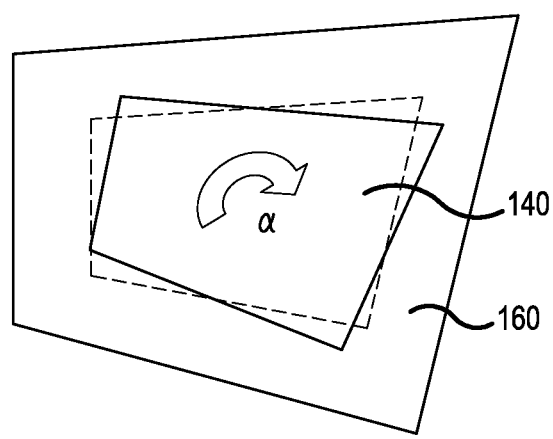
FIG. 1D is a top view of an acoustic resonator showing rotational secondary apodization of a lateral performance enhancement feature, according to a representative embodiment.

From a design perspective, the secondary apodization may be accomplished in a number of ways, examples of which are shown in FIGS. 1C and 1D. In particular, FIG. 1C provides an example of translational secondary apodization, according to which each vertex of the polygon shaped inner perimeter of the outer frame 160 is effectively translated from an initial shape (i.e., the reference shape), indicated by dashed lines, into different x and y coordinates by a corresponding vector ($P_{iX}$, $P_{iY}$), where i=1, 2, 3, 4 (for a quadrilateral shape of the top electrode 140). This translation of the vertices changes the shape and orientation of the resulting inner perimeter of the outer frame 160, indicated by solid lines. FIG. 1D provides an example of rotational secondary apodization, according to which the polygon shaped inner perimeter of the outer frame 160 is effectively rotated by a predetermined angle ($\alpha$). This rotating changes the orientation of the inner perimeter of the outer frame 160 from an initial orientation (i.e., of the reference shape), indicated by dashed lines, to the rotated orientation, indicated by solid lines).

In various embodiments, the substrate 110 may be formed of a material compatible with semiconductor processes, such as silicon (Si), gallium arsenide (GaAs), indium phosphide (InP), glass, sapphire, alumina, or the like, for example. The cavity 115 may be formed by etching a cavity in the substrate 110 and filling the etched cavity with a sacrificial material, such as phosphosilicate glass (PSG), for example, which is subsequently removed to leave an air space. Various illustrative fabrication techniques for an air cavity in a substrate are described by U.S. Pat. No. 7,345,410 (Mar. 18, 2008), to Grannen et al., which is hereby incorporated by reference in its entirety.

The bottom electrode 120 may be formed of one or more electrically conductive materials, such as various metals compatible with semiconductor processes, including tungsten (W), molybdenum (Mo), iridium (Ir), aluminum (Al), platinum (Pt), ruthenium (Ru), niobium (Nb), or hafnium (Hf), for example. In various configurations, the bottom electrode 120 may be formed of two or more layers of electrically conductive materials, which may by the same as or different from one another. Likewise, the top electrode 140 may be formed of electrically conductive materials, such as various metals compatible with semiconductor processes, including tungsten (W), molybdenum (Mo), iridium (Ir), aluminum (Al), platinum (Pt), ruthenium (Ru), niobium (Nb), or hafnium (Hf), for example. In various configurations, the top electrode 140 may be formed of two or more layers of electrically conductive materials, which may by the same as or different from one another. Also, the configuration and/or the material(s) forming the top electrode 140 may be the same as or different from the configuration and/or the material(s) forming the bottom electrode 120.

The planarization layer 125 may be formed of borosilicate glass (BSG), for example. The planarization layer 125 is not strictly required for the functioning of acoustic resonator 100, but its presence can confer various benefits. For instance, the presence of the planarization layer 125 tends to improve the structural stability of acoustic resonator 100, may improve the quality of growth of subsequent layers, and may allow bottom electrode 120 to be formed without its edges extending beyond the cavity 115. Further examples of potential benefits of planarization are presented in U.S. Patent Application Publication No. 2013/0106534 (published May 2, 2013) to Burak et al., which is hereby incorporated by reference in its entirety.

The piezoelectric layer 130 may be formed of any piezoelectric material compatible with semiconductor processes, such as aluminum nitride (AlN), zinc oxide (ZnO), or zirconate titanate (PZT), for example. Also, in various embodiments, piezoelectric layer 130 may be "doped" with at least one rare earth element, such as scandium (Sc), yttrium (Y), lanthanum (La), or erbium (Er), for example, to increase the piezoelectric coupling coefficient $e_{33}$ in the piezoelectric layer 130, thereby off-setting at least a portion of the degradation of the electromechanical coupling coefficient $Kt^2$ of the acoustic resonator caused by the outer frame 160 (and/or the wing 370, discussed below). Examples of doping piezoelectric layers with one or more rare earth elements for improving electromechanical coupling coefficient $Kt^2$ are provided by U.S. patent application Ser. No. 13/662,425 (filed Oct. 27, 2012), to Bradley et al. (published as U.S. Patent App. Pub. No. 2014/0118089 on May 1, 2014, and issued as U.S. Pat. No. 9,225,313 on Dec. 29, 2015), and U.S. patent application Ser. No. 13/662,460 (filed Oct. 27, 2012), to Grannen et al. (issued as U.S. Pat. No. 9,136,819 on Sep. 15, 2015). which are hereby incorporated by reference in their entireties. Of course, doping piezoelectric layers with one or more rare earth elements may be applied to any of various embodiments, including the embodiments described below with reference to the other figures.

The outer frame 160 may be an add-on frame, and may be formed of one or more conductive or dielectric materials, such as copper (Cu), molybdenum (Mo), aluminum (Al), tungsten (W), iridium (Ir), borosilicate glass (BSG), tetra-ethyl orthosilicate (TEOS), carbon-doped silicon oxide (CDO), silicon carbide (SiC), silicon nitride (SiN), silicon dioxide ($SiO_2$), aluminum oxide ($Al_2O_3$), aluminum nitride (AlN), zinc oxide (ZnO), lead zirconium titanate (PZT), diamond or diamond-like carbon (DLC), for example. The outer frame 160 may be formed of the same or different materials than the top electrode 140.

Of course, other materials may be incorporated into the above and other features of acoustic resonator 100 (as well as the other acoustic resonator described herein) without departing from the scope of the present teachings.

During illustrative operation of the acoustic resonator 100 (e.g., as a part of a ladder filter), an input electrical signal is applied to an input terminal of bottom electrode 120 and top electrode 140 is connected to an output terminal. The input electrical signal typically comprises a time-varying voltage that causes vibration in the main membrane region 102. This vibration in turn produces an output electrical signal at an output terminal of top electrode 140. The input and output terminals may be connected to bottom and top electrodes 120 and 140 via connection edges that extend away from the main membrane region 102 as shown in FIG. 1B. The input and output terminals of acoustic resonator 100 may be connected to appropriate terminals of other acoustic resonators forming the ladder filter, for instance.

Figure 2:
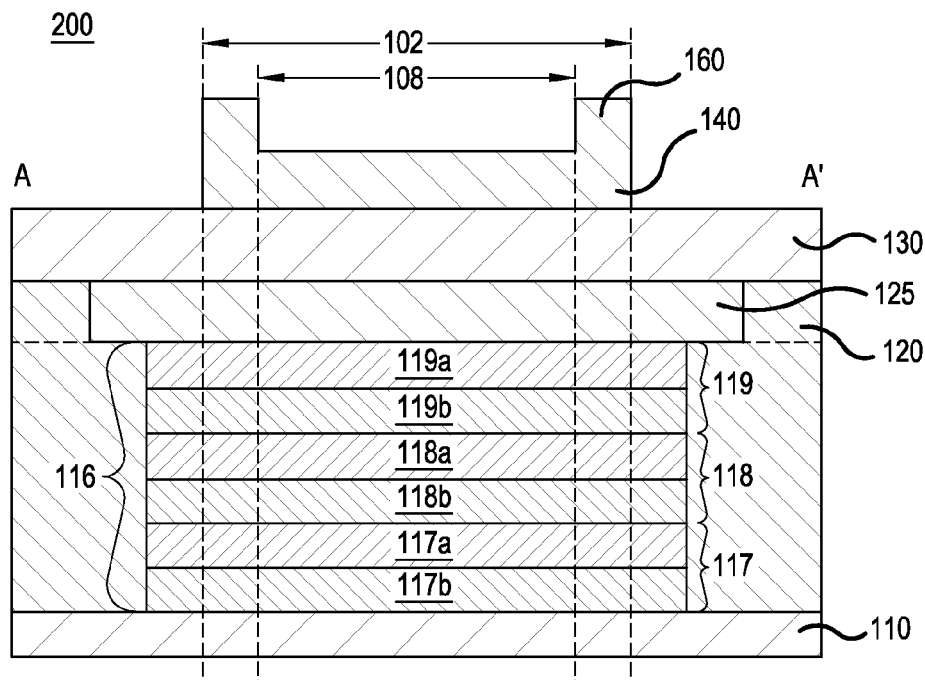
FIG. 2 is a cross-sectional view of a surface mounted resonator (SMR), according to a representative embodiment.

FIG. 2 depicts an acoustic resonator 200, which is an SMR, according to a representative embodiment. The acoustic resonator 200 has the same apodized shape(s) shown in FIG. 1A, discussed above, but is formed as an SMR as opposed to an FBAR.

More particularly, the acoustic resonator 200 includes a substrate 110, an acoustic reflector 116 disposed on the substrate 110, a bottom (first) electrode 120 disposed on the acoustic reflector 116, a planarization layer 125 disposed adjacent to bottom electrode 120 on the acoustic reflector 116, a piezoelectric layer 130 disposed on the bottom electrode 120 and the planarization layer 125, and a top (second) electrode 140 disposed on the piezoelectric layer 130. The acoustic reflector 116 may be an acoustic mirror, such as a distributed Bragg reflector (DBR). The acoustic reflector 116 includes multiple pairs of acoustic reflector layer pairs, indicated by representative first acoustic reflector layer pair 117, second acoustic reflector layer pair 118, and third acoustic reflector layer pair 119, sequentially stacked on the substrate 110. The first acoustic reflector layer pair 117 includes first low acoustic impedance layer 117a formed of low acoustic impedance material stacked on first high acoustic impedance layer 117b formed of high acoustic impedance material. The second acoustic reflector layer pair 118 includes second low acoustic impedance layer 118a formed of low acoustic impedance material stacked on second high acoustic impedance layer 118b formed of high acoustic impedance material. The third acoustic reflector layer pair 119 includes third low acoustic impedance layer 119a formed of low acoustic impedance material stacked on third high acoustic impedance layer 119b formed of high acoustic impedance material.

Each of the first, second and third low acoustic impedance layers 117a, 118a and 119a may be formed of various low acoustic impedance materials, such as boron silicate glass (BSG), tetra-ethyl-ortho-silicate (TEOS), silicon oxide ($SiO_x$) or silicon nitride ($SiN_x$) (where x is an integer), carbon-doped silicon oxide (CDO), chemical vapor deposition silicon carbide (CVD SiC), plasma enhanced CVD SiC (PECVD SiC), titanium (Ti) or aluminum. Each of the first, second and third high acoustic impedance layers 117b, 118b and 119b may be formed of various high acoustic impedance materials, such as tungsten (W), molybdenum (Mo), niobium molybdenum (NbMo), iridium (Ir), hafnium oxide ($HfO_2$), aluminum oxide ($Al_2O_3$), diamond or diamond-like carbon (DLC). Various illustrative fabrication techniques of acoustic mirrors are described by in U.S. Pat. No. 7,358,831 (Apr. 15, 2008), to Larson III, et al., which is hereby incorporated by reference in its entirety.

Collectively, the bottom electrode 120, the piezoelectric layer 130, and the top electrode 140 constitute an acoustic stack of the acoustic resonator 200. Also, an overlap among the bottom electrode 120, the piezoelectric layer 130 and the top electrode 140 over the acoustic reflector 116 defines a main membrane region 102 of the acoustic resonator 200. Dotted vertical lines indicate the boundary of the main membrane region 102. The acoustic resonator 200 further includes a representative lateral performance enhancement feature, indicated as outer frame 160 formed on the top electrode 140, around an outer perimeter of the top electrode 140. As discussed above, the outer frame 160 has inner edges that define a boundary of an active region 108 formed within the main membrane region 102. The outer edges of the outer frame 160 may coincide with the outer edges of the bottom electrode 120. Each of the top electrode 140 and the outer frame 160 has an apodized shape, as described above, and thus the descriptions will not be repeated.

Figure 3A:
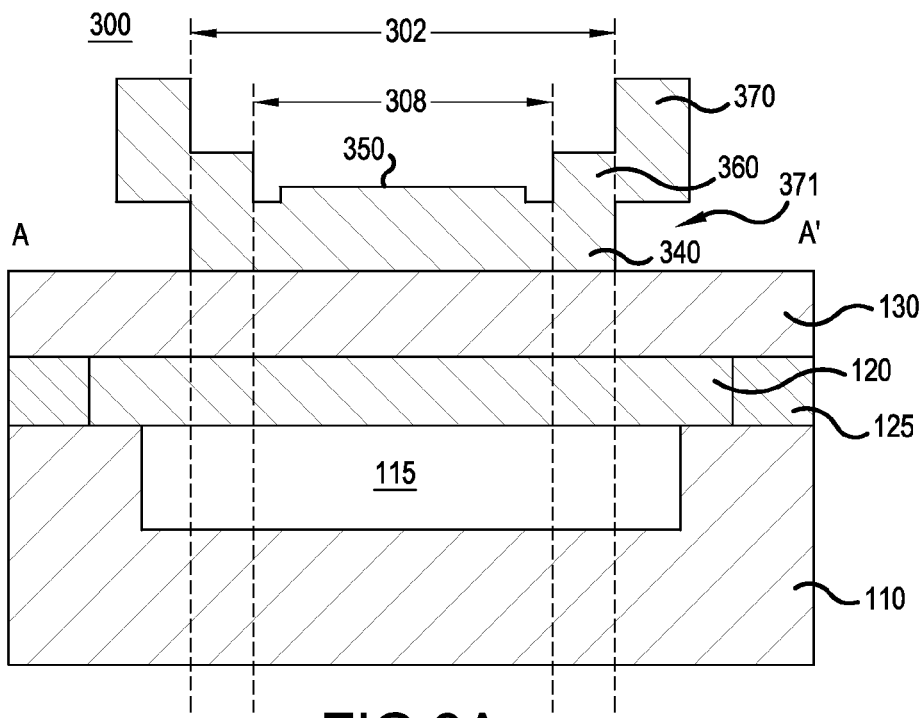
FIG. 3A is a cross-sectional view of an FBAR, according to a representative embodiment.

FIG. 3A is a cross-sectional view of an acoustic resonator, and FIGS. 3B-3G are various top views of an acoustic resonator, according to various representative embodiments. FIG. 3A may be taken along a line A-A' in any one of FIGS. 3B-3G.

Figure 3B:
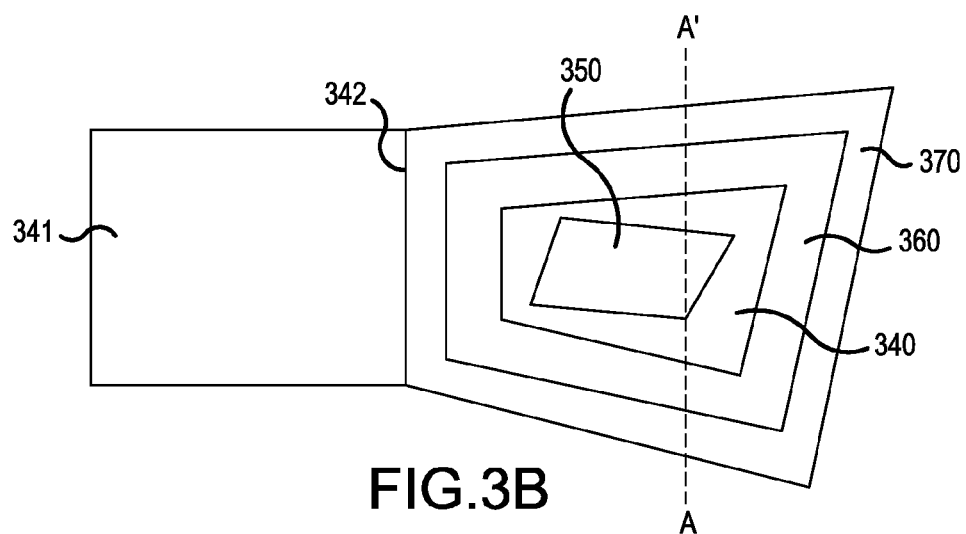
FIG. 3B is a top view of an acoustic resonator having two lateral performance enhancement features with different apodized shapes, according to a representative embodiment.

Referring first to FIGS. 3A and 3B, an acoustic resonator 300, which is an FBAR, is depicted for purposes of illustration. The acoustic resonator 300 includes a substrate 110 defining an air cavity 115, a bottom (first) electrode 120 disposed on the substrate 110 and air cavity 115, a planarization layer 125 disposed adjacent to bottom electrode 120 on the substrate 110, a piezoelectric layer 130 disposed on the bottom electrode 120 and the planarization layer 125, and a top (second) electrode 340 disposed on the piezoelectric layer 130. Collectively, the bottom electrode 120, the piezoelectric layer 130, and the top electrode 340 constitute an acoustic stack of the acoustic resonator 300. Also, an overlap among the bottom electrode 120, the piezoelectric layer 130 and a portion of the top electrode 340 in contact with the piezoelectric layer 130 over the air cavity 115 defines a main membrane region 302 of the acoustic resonator 300. Dotted vertical lines indicate the boundary of the main membrane region 302.

The acoustic resonator 300 further includes representative lateral performance enhancement features, indicated as inner frame 350 formed in a center region on the top electrode 340, outer frame 360 formed on the top electrode 340 in an outer region of the main membrane region 302 (e.g., around an outer perimeter region of the top electrode 340 in the main membrane region 302), and wing 370 formed around an outer perimeter of the outer frame 360. The wing 370 creates an air-gap, referred to as air-ring 371, between the wing 370 and the piezoelectric layer 130 that surrounds the outside perimeter of the top electrode 340 in the main membrane region 302. The outer frame 360 has inner edges that define a boundary of an active region 308 formed within the main membrane region 302. As should be appreciated by one skilled in the art, the outer frame 360 forms an effective Low Velocity Frame, and the region between the outer edge of inner frame 350 and inner edge of outer frame 360 forms an effective High Velocity Frame discussed above. The outer edges of the outer frame 360 define the outer edges of the main membrane region 302. The outer edges of the outer frame 360 also may coincide with the inner edges of the wing 370. Although not shown, a passivation layer may be present on top of top electrode 340, the inner frame 350, the outer frame 360 and the wing 370 (in each embodiment discussed herein) with a thickness sufficient to insulate all layers of the acoustic stack from the environment, including protection from moisture, corrosives, contaminants, debris and the like.

The air-ring 371 may include an air-bridge disposed on the connection side 341, and an air-wing disposed along the remaining sides of the acoustic resonator 300 (i.e., along the remaining perimeter). The air-bridge is therefore enclosed by the top electrode 340, and the air-wing is therefore is open on one side. From the perspective of FIG. 3A, only the air-wing portion of the air-ring 371 is visible. Although the air-ring 371 is shown with rectangular shaped cross-sections, these structures (and air-bridges or air-wings described herein) may have other shapes, such as trapezoidal cross-sectional shapes, without departing from the scope of the present teachings. Examples of configurations, dimensions, alternative shapes, and the like with regard to air-bridges and/or air-wings are described and illustrated in U.S. Patent Application Publication No. 2012/0218057 (published Aug. 30, 2012) to Burak et al., U.S. Patent Application Publication No. 2010/0327697 (published Dec. 30, 2010) to Choy et al.; and U.S. Patent Application Publication No. 2010/0327994 (published Dec. 30, 2010) to Choy et al., the disclosures of which are hereby incorporated by reference in their entireties.

In certain embodiments, the air-ring 371 extends over the cavity 115 by an overlap (also referred to as decoupling region), determining separation of the outer edge of the main membrane region 302 from the substrate 110 edge. Also, the air-bridge (not shown) of the air-ring 371 extends over the piezoelectric layer 130 by an air-bridge extension. The decoupling region has a width (x-dimension) of approximately 0.0 μm (i.e., no overlap with the cavity 115) to approximately 10.0 μm, and the air-bridge extension region has a width of approximately 0.0 μm (i.e., no air-bridge) to approximately 50.0 μm.

As shown in FIG. 3B, for example, each of the top electrode 340 the inner frame 350, the outer frame 360 and the wing 370 has an apodized shape. In the depicted example, each of the apodized shapes is a polygon shape, meaning that it is formed of straight line segments (or edges) joined at vertices (or corners) to form a closed figure, as discussed above. The apodized shapes in FIG. 3B are quadrilateral shapes since they have four sides. However, in alternative embodiments, any other polygon shapes, such as a triangle (three sides), a pentagon (five sides), or a hexagon (six sides), etc., may be incorporated without departing from the scope of the present teachings. The top electrode 340 also has a connection side 341 configured to provide an electrical connection to interconnect 342. The interconnect 342 provides electrical signals to top electrode 340 to excite desired acoustic waves in the piezoelectric layer 130 of the acoustic resonator 300.

In various embodiments, the apodized shapes of at least two of the top electrode 340, the inner frame 350, the outer frame 360 and the wing 370 are different from one another. Referring to FIG. 3B in particular, for purposes of illustration, the shape of the top electrode 340 (at outer edges of the main membrane region 302) may be referred to as the primary apodization (or reference apodization) and the shape of the inner frame 350 (outer edges) may be referred to as the secondary apodization. Alternatively, the shapes of the outer frame 360 (inner or outer edges) or the wing 370 (outer edges) may be referred to as the primary apodization since they are substantially the same as the shape of the top electrode 340 mentioned above, although different sizes.

Figure 3C:
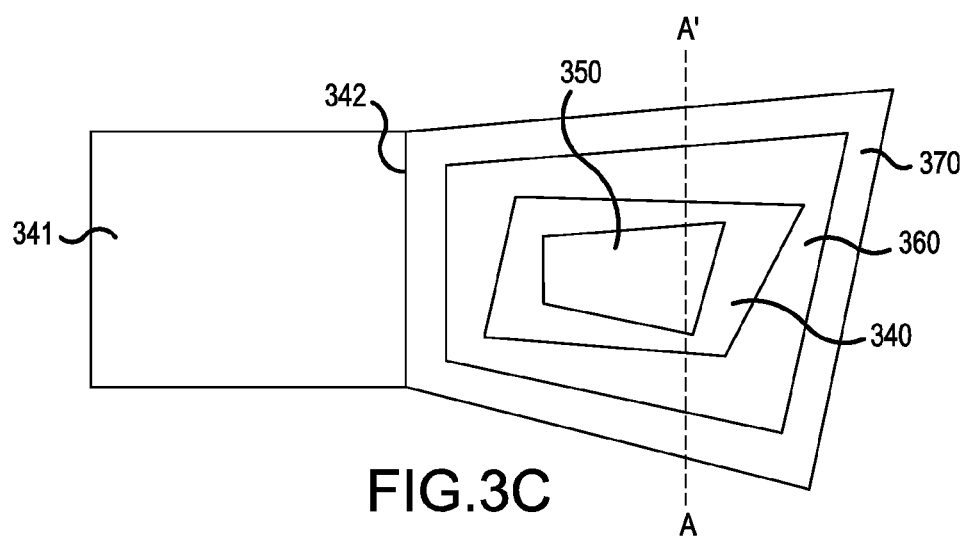
FIG. 3C is a top view of an acoustic resonator having two lateral performance enhancement features with different apodized shapes, according to a representative embodiment.
Figure 3D:
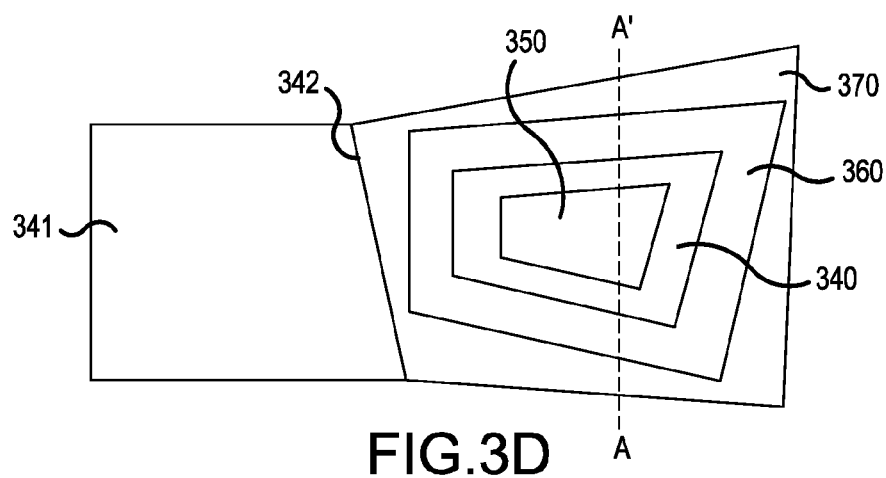
FIG. 3D is a top view of an acoustic resonator having two lateral performance enhancement features with different apodized shapes, according to a representative embodiment.

Each of FIGS. 3B, 3C and 3D depict examples in which one of the top electrode and the three lateral performance enhancement features has an apodized shape different from the apodized shapes of the others of the top electrode and the three lateral performance enhancement features. It is understood that the shape of the top electrode 340, in discussing FIGS. 3A to 3G, 4 and 5, refers to the shape of the portion of the electrode 340 (e.g., in contact with the piezoelectric layer 130) at the outer edges or outer boundary of the main membrane region 302, such that the shape of the electrode 340 and the shape of the outer boundary of the main membrane region 302 are the same in the depicted embodiments. In FIG. 3B, the inner frame 350 has an apodized shape different from the apodized shapes of the top electrode 340, the outer frame 360 and the wing 370 (which have the same apodized shapes). The apodized shape of the inner frame 350 is formed by the corresponding shape of its outer edges. Thus, as discussed above, the apodized shape of the inner frame 350 may be referred to as the secondary apodization and the apodized shape of the top electrode 340 may be referred to as the reference apodization.

In FIG. 3C, the outer frame 360 has an apodized shape different from the apodized shapes of the top electrode 340, the inner frame 350 and the wing 370 (which have the same apodized shapes). The apodized shape of the outer frame 360 is formed by the corresponding shapes of its inner and outer edges. More particularly, the inner edges have an apodized shape that is different from those of the top electrode 340, the inner frame 350 and the wing 370, while the outer edges have an apodized shape that is the same as those of the electrode top 340, the inner frame 350 and the wing 370 (and effectively coincides with the apodized shape of the outer edges of the top electrode 340). Thus, it is the inner edges of the outer frame 360 that provide the different apodized shape. As discussed above, the apodized shape of the outer frame 360 may be referred to as the secondary apodization and the apodized shape of the top electrode 340 may be referred to as the reference apodization.

In FIG. 3D, the wing 370 has an apodized shape different from the apodized shapes of the top electrode 340, the inner frame 350 and the outer frame 360 (which have the same apodized shapes). The apodized shape of the wing 370 is formed by the corresponding shapes of its inner and outer edges. More particularly, the inner edges have an apodized shape that is the same as those of the top electrode 340, the inner frame 350 and the outer frame 360 (and effectively coincides with the apodized shapes of the outer edges of the top electrode 340 and the outer edges of the outer frame 360), while the outer edges have a different apodized shape than those of the top electrode 340, the inner frame 350 and the outer frame 360. Thus, it is the outer edges of the wing 370 that provide the different apodized shape. As discussed above, the apodized shape of the wing 370 may be referred to as the secondary apodization and the apodized shape of the top electrode 340 may be referred to as the reference apodization.

Of course, more than one of the top electrode and the three lateral performance enhancement features (e.g., two, three or even all four) may have apodized shapes different from the apodized shapes of the others of the top electrode and the three lateral performance enhancement features, without departing from the scope of the present teachings. For instance, each of FIGS. 3E, 3F and 3G depict examples in which two of the top electrode and the three lateral performance enhancement features have apodized shapes different from the apodized shapes of the others of the top electrode and the three lateral performance enhancement features.

Figure 3E:
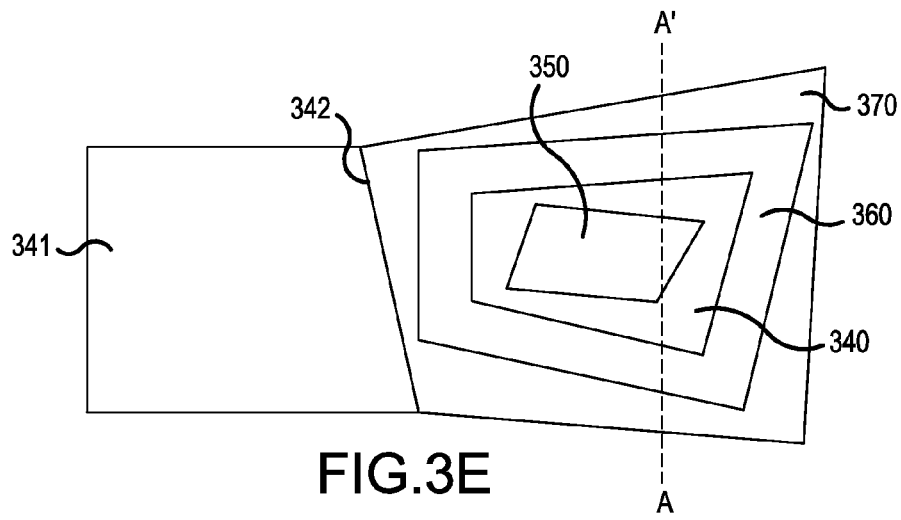
FIG. 3E is a top view of an acoustic resonator having two lateral performance enhancement features with different apodized shapes, according to a representative embodiment.

In FIG. 3E, the inner frame 350 and the wing 370 have apodized shapes different from the apodized shapes of the top electrode 340 and the outer frame 360 (which have the same apodized shapes), and different from one another. The apodized shape of the inner frame 350 is formed by the corresponding shape of its outer edges, and the apodized shape of the wing 370 is formed by the corresponding shapes of its inner and outer edges, as discussed above. Thus, the apodized shape of the inner frame 350 may be referred to as the secondary apodization, the apodized shape of the wing 370 may be referred to as a tertiary apodization, and the apodized shape of the top electrode 340 may be referred to as the reference apodization, for example.

Figure 3F:
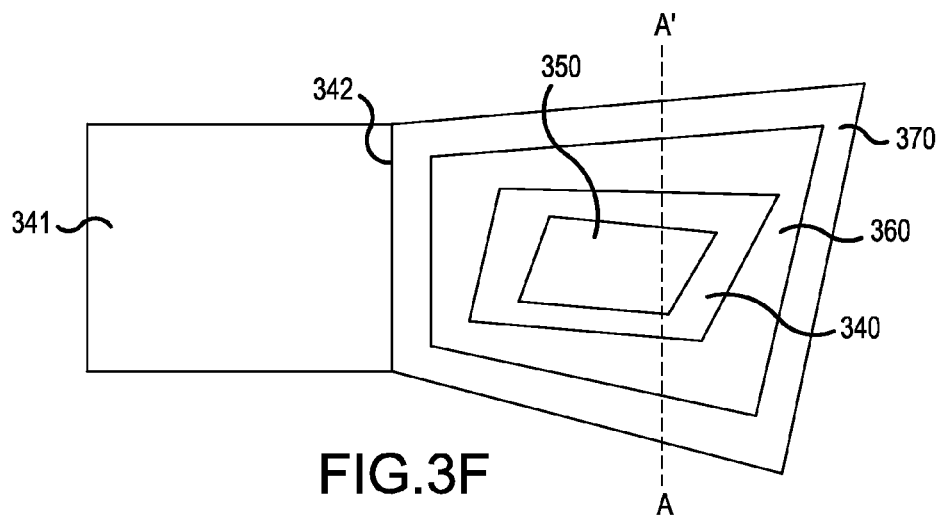
FIG. 3F is a top view of an acoustic resonator having two lateral performance enhancement features with different apodized shapes, according to a representative embodiment.

In FIG. 3F, the inner frame 350 and the outer frame 360 have apodized shapes different from the apodized shapes of the top electrode 340 and the wing 370 (which have the same apodized shapes), and different from one another. The apodized shape of the inner frame 350 is formed by the corresponding shape of its outer edges, and the apodized shape of the outer frame 360 is formed by the corresponding shapes of its inner and outer edges, as discussed above. Thus, the apodized shape of the inner frame 350 may be referred to as the secondary apodization, the apodized shape of the outer frame 360 may be referred to as a tertiary apodization, and the apodized shape of the top electrode 340 may be referred to as the reference apodization, for example.

Figure 3G:
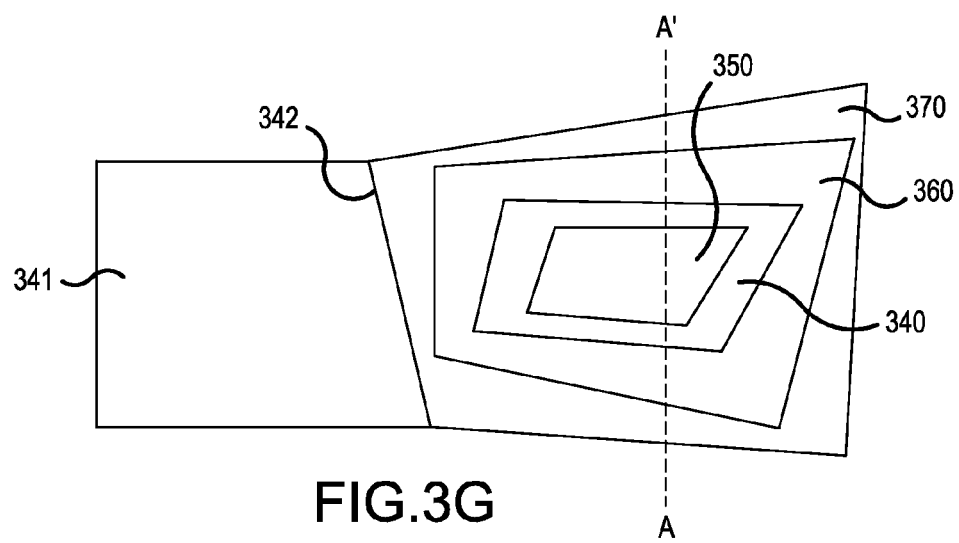
FIG. 3G is a top view of an acoustic resonator having two lateral performance enhancement features with different apodized shapes, according to a representative embodiment.

In FIG. 3G, the outer frame 360 and the wing 370 have apodized shapes different from the apodized shapes of the top electrode 340 and the inner frame 350 (which have the same apodized shapes), and different from one another. The apodized shape of the outer frame 360 is formed by the corresponding shapes of its inner and outer edges, and the apodized shape of the wing 370 is formed by the corresponding shapes of its inner and outer edges, as discussed above. Thus, the apodized shape of the outer frame 360 may be referred to as the secondary apodization, the apodized shape of the wing 370 may be referred to as a tertiary apodization, and the apodized shape of the top electrode 340 may be referred to as the reference apodization, for example.

Figure 4:
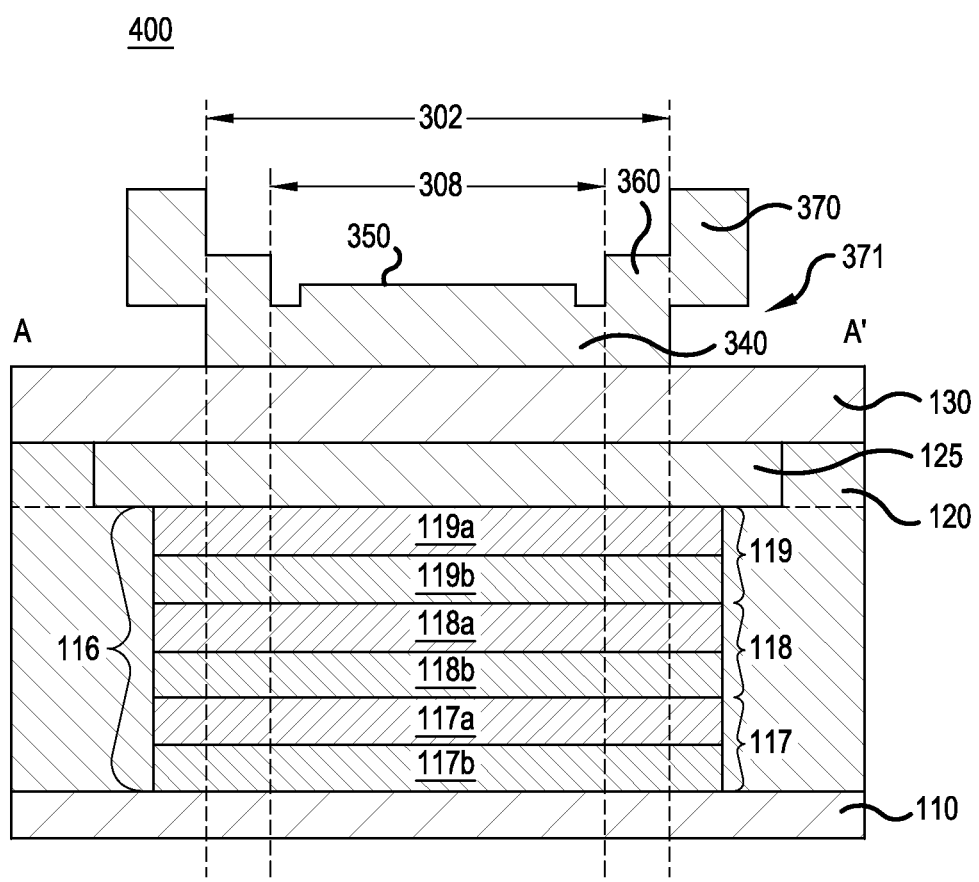
FIG. 4 is a cross-sectional view of an SMR, according to a representative embodiment.

FIG. 4 depicts an acoustic resonator 400, which is an SMR, according to a representative embodiment. The acoustic resonator 400 may have any of the same apodized shapes shown in FIGS. 3B through 3G, discussed above, but is formed as an SMR as opposed to an FBAR.

More particularly, the acoustic resonator 400 includes a substrate 110, an acoustic reflector 116 disposed on the substrate 110, a bottom (first) electrode 120 disposed on the acoustic reflector 116, a planarization layer 125 disposed adjacent to bottom electrode 120 on the acoustic reflector 116, and a piezoelectric layer 130 disposed on the bottom electrode 120 and the planarization layer 125, and a top (second) electrode 340 disposed on the piezoelectric layer 130. The acoustic reflector 116 may be an acoustic mirror, such as a distributed Bragg reflector (DBR). The acoustic reflector 116 includes multiple pairs of acoustic reflector layer pairs, indicated by representative first acoustic reflector layer pair 117, second acoustic reflector layer pair 118, and third acoustic reflector layer pair 119, sequentially stacked on the substrate 110. The first acoustic reflector layer pair 117 includes first low acoustic impedance layer 117a formed of low acoustic impedance material stacked on first high acoustic impedance layer 117b formed of high acoustic impedance material. The second acoustic reflector layer pair 118 includes second low acoustic impedance layer 118a formed of low acoustic impedance material stacked on second high acoustic impedance layer 118b formed of high acoustic impedance material. The third acoustic reflector layer pair 119 includes third low acoustic impedance layer 119a formed of low acoustic impedance material stacked on third high acoustic impedance layer 119b formed of high acoustic impedance material.

Collectively, the bottom electrode 120, the piezoelectric layer 130, and the top electrode 340 constitute an acoustic stack of the acoustic resonator 400. Also, an overlap among the bottom electrode 120, the piezoelectric layer 130 and a portion of the top electrode 340 in contact with the piezoelectric layer 130 over the acoustic reflector 116 defines a main membrane region 302 of the acoustic resonator 400. Dotted vertical lines indicate the boundary of the main membrane region 302. The acoustic resonator 400 further includes representative lateral performance enhancement features, indicated as inner frame 350 formed in a center region on the top electrode 340, outer frame 360 formed on the tope electrode 340 in an outer region of the main membrane region 302 (e.g., around an outer perimeter region of the top electrode 340 in the main membrane region 302), and wing 370 formed around an outer perimeter of the outer frame 360, as discussed above with reference to FIG. 3A. As discussed above, the outer frame 360 has inner edges that define a boundary of an active region 308 formed within the main membrane region 302. The outer edges of the outer frame 360 may coincide with the outer edges of the top electrode 340 in the main membrane region 302. Each of the top electrode 340, the inner frame 350, the outer frame 360 and the wing 370 has an apodized shape, at least one of which is different than the others, as described above. Thus, the descriptions will not be repeated.

Figure 5:
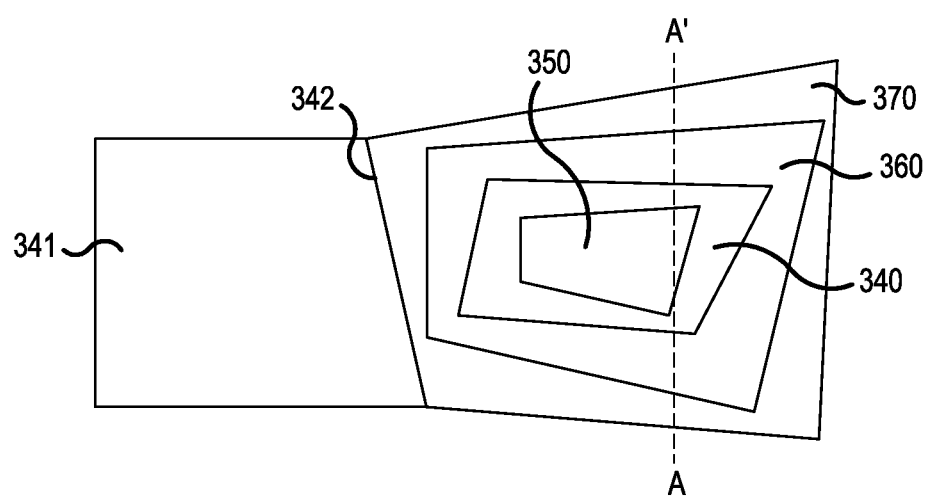
FIG. 5 is a top view of an acoustic resonator having three lateral performance enhancement features with different apodized shapes, according to a representative embodiment.

FIG. 5 is a top view of an acoustic resonator, according to a representative embodiment. In various embodiments, the top view of the acoustic resonator shown in FIG. 5 may be applied to various types of acoustic resonators, without departing from the scope of the present teaching For example, the cross-section of the FBAR shown in FIG. 3A or the cross-section of the SMR shown in FIG. 4 may be taken along a line A-A' in FIG. 5.

As shown in FIG. 5, for example, each of the top electrode 340, the inner frame 350, the outer frame 360 and the wing 370 has an apodized shape. In the depicted example, each of the apodized shapes is a polygon shape, meaning that it is formed of straight line segments (or edges) joined at vertices (or corners) to form a closed figure, as discussed above. The apodized shapes in FIG. 5 are quadrilateral shapes since they have four sides. However, in alternative embodiments, any other polygon shapes, such as a triangle (three sides), a pentagon (five sides), or a hexagon (six sides), etc., may be incorporated without departing from the scope of the present teachings. The top electrode 340 also has a connection side 341 configured to provide an electrical connection to interconnect 342. The interconnect 342 provides electrical signals to top electrode 340 to excite desired acoustic waves in the piezoelectric layer 130 of the acoustic resonator 300, 400.

In various embodiments, the apodized shapes of at least three of the top electrode 340, the inner frame 350, the outer frame 360 and the wing 370 are different from one another. Referring to FIG. 5 in particular, for purposes of illustration, the shape of the top electrode 340 (outer edges) may be referred to as the reference apodization, the shape of the inner frame 350 (outer edges) may be referred to as the secondary apodization, the shape of the outer frame 360 (inner or outer edges) may be referred to as the tertiary apodization, and the shape of the wing 370 (outer edges) may be referred to as the quaternary apodization. From a design perspective, the various apodized shapes and/or orientations of the top electrode and the lateral performance enhancement features may be obtained using translational and/or rotational apodization, as discussed above with reference to FIGS. 1C and 1D, for example.

Figure 6:
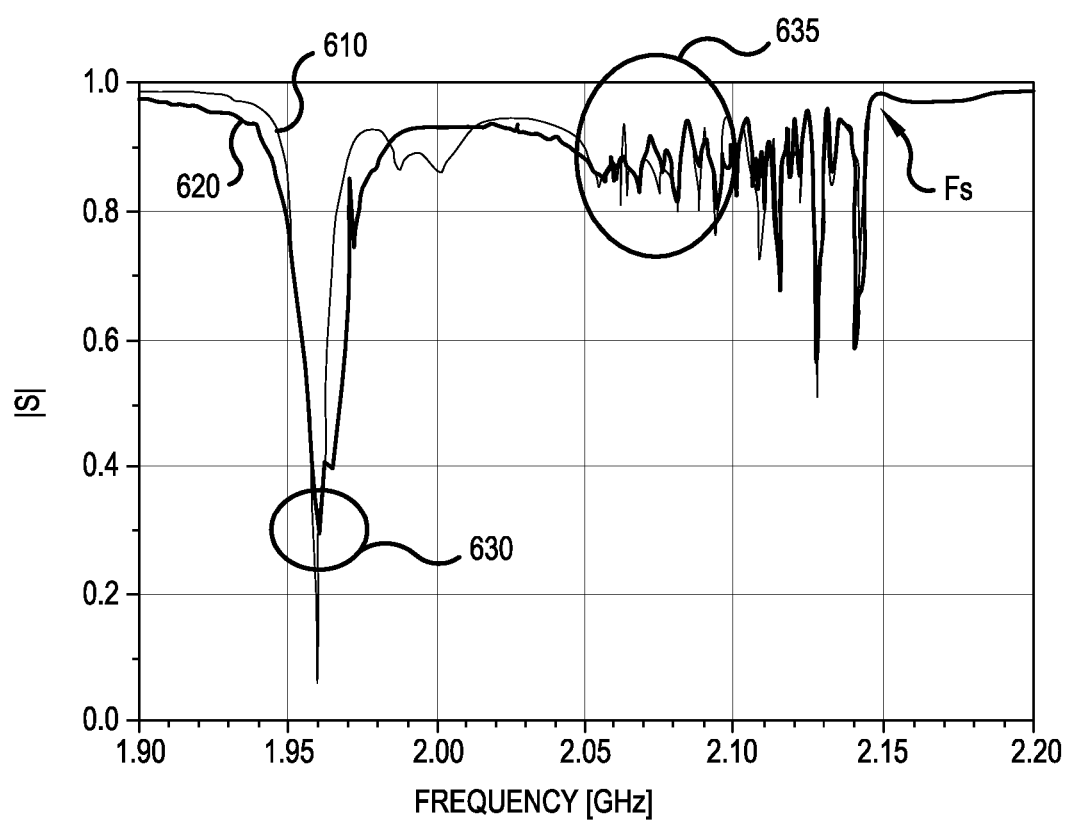
FIG. 6 is a graph showing numerically calculated magnitudes of S-parameters for secondary apodization of a wing of an acoustic resonator device, according to a representative embodiment.

FIG. 6 is a graph showing numerically calculated magnitudes of S-parameters for secondary apodization of a wing of an acoustic resonator device, according to a representative embodiment depicted in FIG. 3A. More specifically, the bottom electrode 120 is formed of Mo of approximate thickness 3000 Å, the piezoelectric layer 130 is formed of AlN of approximate thickness 10000 Å, the top electrode 340 is formed of Mo of approximate thickness 2200 Å, and passivation layer (not shown in FIG. 3A) is formed of AlN of approximate thickness 2400 Å. Notably, the inner frame 350 has been omitted in the simulations, and outer frame 360 is formed of Mo of approximate thickness 1000 Å.

Referring to FIG. 6, the x-axis indicates frequency of an applied electrical signal (GHz), and the y-axis indicates magnitudes of S-parameters |S| (arbitrary units). The acoustic resonator device from which the graph shown in FIG. 6 is derived has an apodized pentagon shape, and includes an outer frame (such as outer frame 360, but with five non-parallel sides instead of four) approximately 5.25 μm in width, and a wing (such as wing 370, except with five non-parallel sides instead of four) approximately 3.5 μm in width. The outer frame has an apodized outer frame shape and the top electrode has an apodized electrode shape (reference apodization) that are substantially the same, where the outer edges of the outer frame substantially coincide with the outer edges of the top electrode. The wing has an apodized wing shape (secondary apodization) that is different (translated and/or rotated) from the apodized outer frame and electrode shapes.

Plot 610 shows the magnitudes of the S-parameters |S| as a function of frequency of electrical signal applied to a pentagon shaped acoustic resonator device with an outer frame and a wing having the same apodization. Plot 620 shows the magnitudes of the S-parameters |S| as a function of frequency of the pentagon shaped acoustic resonator device with secondary apodization of the wing, as discussed above. By comparing plots 610 and 620, it is apparent that the secondary apodization of the wing suppresses resonance of the outer frame at about 1.96 GHz, indicated by circle 630, and suppresses rattles in the 2.05-2.10 GHz range (e.g., southwest "rattles" in a Smith-chart polar plot), indicated by circle 635. The series resonance frequency Fs of the acoustic resonator device is approximately 2.15 GHz.

Generally, rattles are caused by excitation of a propagating thickness extensional mode pTE1, e.g., at the edge of the top electrode (e.g., the top electrode 340) for driving frequencies below series resonance frequency Fs. For so-called type-II acoustic stacks (as considered in the present teachings), the evanescent eTE1-mode above series resonance frequency Fs corresponds to the propagating pTE1-mode below series resonance frequency Fs. In an FBAR, the total motion at the top electrode edge is suppressed due to the fact that the field region (outside of the top electrode) is far-off resonance as compared to the main membrane region. For a driving frequency below the series resonance frequency Fs, that suppression of the total motion at the top electrode edge is accomplished by excitation of pTE1-mode in opposite phase to the Mason pseudo-mode.

However, since pTE1-mode (eigen-mode) supports both longitudinal and shear components, and Mason pseudo-mode is purely longitudinal, generally only a partial suppression of the total motion at the electrode edge can be accomplished. For example when shear component of pTE1-mode forms nodes (nulls) at the edges of the top electrode (as determined by the lateral extension of the active region and dispersion diagram for stack eigen-modes), a close to complete suppression of total motion may occur and the radiative loss is minimized. Electrically, it is manifested by |S| values close to 1 at that specific frequency. However, when shear component of pTE1-mode forms anti-nodes (attains maximum values) at the edges of the top electrode, a suppression of total motion cannot occur and the radiative loss is maximized by excitation of additional propagating modes supported by the stacks on both sides of top electrode edge. Electrically, it is manifested by |S| values substantially lower than 1 at that specific frequency. At the frequency corresponding to maximum radiative loss (or anti-nodes of the pTE1-mode shear components at the top electrode edges), the so-called rattle is formed in the Smith-chart indicating enhanced radiative loss and significantly lowered quality factor Q of the resonator at that frequency. In other words, a rattle is manifested in a Smith-chart as a loop or an indentation where the scattering parameter S significantly deviates from the unit circle, as should be appreciated by one skilled in the art.

However, the rattle formation may be minimized in FBARs, for example, by using inner frame 350. The mechanism of rattle suppression relies on the suppression of Mason pseudo-mode excitation in the effective High Velocity Frame region, or, in other words, in a trench between the outer edge of the inner frame 350 and the inner edge of the outer frame 360. Such suppression occurs because in the effective HVF region the cut-off frequency is higher than in the active region 308. Therefore, at any electrical signal driving frequency below series resonance frequency Fs, the Mason pseudo-mode amplitude in the effective HVF region is lower than in the active region 308, allowing suppression of the total motion at the edge of the top electrode 340 within the main membrane region 302 and therefore minimizing rattle formation. However, one common disadvantage of using inner frame 350 is that it introduces additional resonance from the HVF region, spectrally located above the series resonance frequency Fs of FBAR 300, which in turn may deteriorate the pass-band quality of FBAR 300. As such, application of the inner frame 350 may be limited to relatively narrow widths of the trench in effective HVF region, therefore reducing its efficiency in suppressing the rattles. As shown in FIG. 6 with plot 620, application of secondary wing apodization may result in similar suppression of rattles in sub-Fs frequency region, but without introducing addition resonances above series resonance frequency Fs. Also, application of secondary wing apodization is beneficial and cost neutral due to lithographic definition of the wing (e.g., the wing 370), while processing of the inner frame 350 requires additional layer deposition and patterning steps, therefore incurring additional cost and increasing cycle time in manufacturing of FBAR 300.

Figure 7:
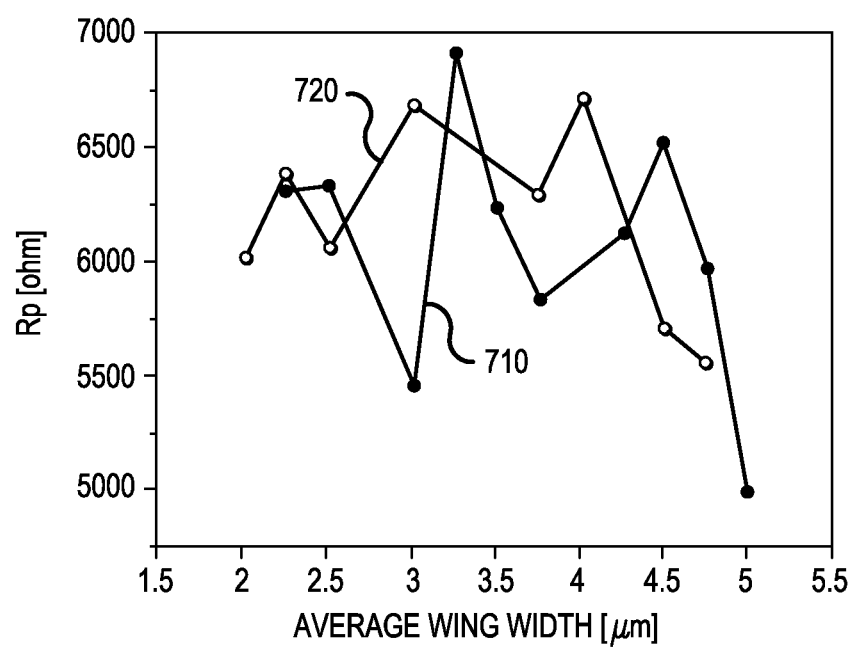
FIG. 7 is a graph showing best parallel resistance Rp as a function of width of an apodized wing of an acoustic resonator device, according to a representative embodiment.

FIG. 7 is a graph showing best parallel resistance Rp as a function of width of an apodized wing width of an acoustic resonator device, according to a representative embodiment.

Referring to FIG. 7, the x-axis indicates average wing width (m), and the y-axis indicates magnitudes of parallel resistance Rp. More specifically, the x-axis indicates an average wing width for a structure with secondary apodized air-wing. As in FIG. 6, discussed above, the acoustic resonator device from which the graph shown in FIG. 7 is derived has an apodized pentagon shape, and includes an outer frame approximately 5.25 µm in width, and a wing having varying widths. The outer frame has an apodized outer frame shape and the top electrode has an apodized electrode shape (reference apodization) in the main membrane region that are substantially the same, where the outer edges of the outer frame substantially coincide with the outer edges of the top electrode in the main membrane region. The wing has an apodized wing shape (secondary apodization) that is different (e.g., translated and/or rotated) from the apodized outer frame and electrode shapes.

Plot 710 shows numerically calculated magnitudes of parallel resistance Rp as a function of wing widths of a pentagon shaped acoustic resonator device with an outer frame and a wing having the same apodization. Plot 720 shows the magnitudes of parallel resistance Rp as a function of wing widths the pentagon shaped acoustic resonator device with secondary apodization of the wing, as discussed above. By comparing plots 710 and 720, it is apparent that the secondary apodization of the wing results in comparable best parallel resistance Rp to the regular apodized design, although the parallel resistance Rp dependence on wing width has been reduced by a factor of approximately three. Thus, there is less sensitivity to process misalignments, for example, in a structure with secondary apodized wings, with the additional benefit of reduced rattles for frequencies below series resonance frequency Fs and reduced strength of the outer frame resonance (discussed in relation to FIG. 6).

As indicated above, acoustic resonators having apodized shaped outer perimeters tend to reduce packing density of an array of acoustic resonators in a package. This is due to the lack of parallel edges that enable particularly close proximity of adjacent acoustic resonators. However, according to representative embodiments, the outer-most edges of adjacent acoustic resonators may be made parallel (e.g., formed in square or substantially rectangular shapes), while the benefits of apodization may still be experienced by providing apodized shapes of features within the outer-most edges of the acoustic resonators, such as edges of the top electrode in the main membrane region (e.g., when the outer-most edges correspond to wings), outer frames and/or inner frames.

Figure 8A:
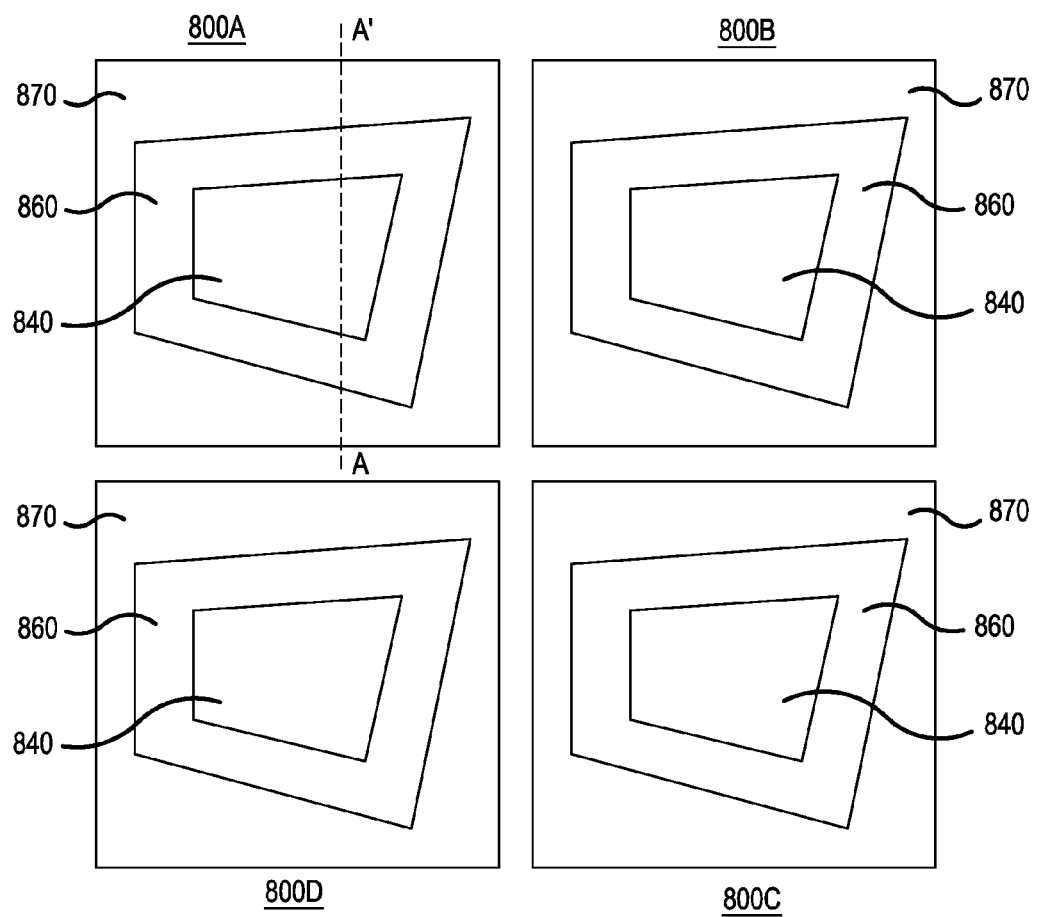
FIG. 8A is a top view of an array of packaged acoustic resonators, each having a substantially square outer perimeter, according to a representative embodiment.
Figure 8B:
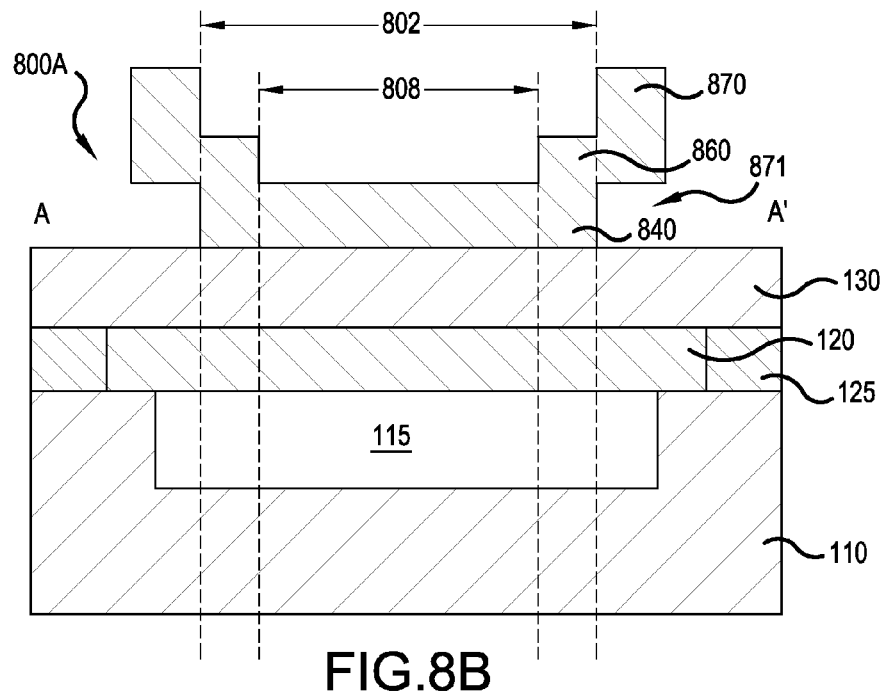
FIG. 8B is a cross-sectional view of one of the acoustic resonators as an FBAR, according to a representative embodiment.
Figure 8C:
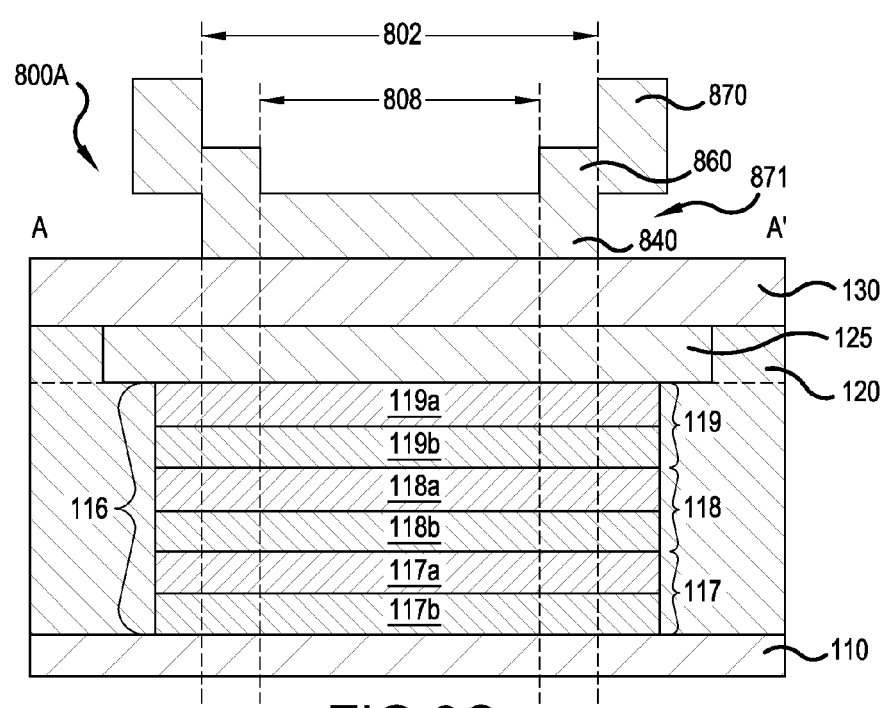
FIG. 8C is a cross-sectional view of one of the acoustic resonators as an SMR, according to a representative embodiment.

FIG. 8A is a top view of an array of packaged acoustic resonators having substantially square outer perimeters to enable high packing density, according to a representative embodiment. FIGS. 8B and 8C are cross-sectional views of one of the acoustic resonators as an FBAR and an SMR, respectively, according to representative embodiments.

FIG. 8A depicts top views of four identical acoustic resonators 800A, 800B, 800C and 800D, arranged in a closely packed array for purposes of packaging. Each of the acoustic resonators 800A-800D includes a top electrode 840 and two lateral performance enhancement features, indicated as outer frame 860 and wing 870. Each of a portion of the top electrode 840 in contact with the piezoelectric layer 130 and the outer frame has an apodized shape, as discussed above. However, the wing 870, which provides the outer-most perimeter of each of the acoustic resonators 800A-800D, has a non-apodized shape, where at least two edges are parallel to one another. Although the non-apodized shape is a square in the depicted example, it is understood that other non-apodized shapes (e.g., a rectangle or other parallelogram) may be incorporated without departing from the scope of the present teachings. Further, if the acoustic resonator does not have a wing (e.g., wing 870), then the top electrode itself may have a non-apodized shape, while one or more lateral performance enhancement features, such as inner and outer frames, may have apodized shapes providing secondary apodization, without departing from the scope of the present teachings.

The apodized shapes of the top electrode 840 in main membrane region 802 and the outer frame 860 are different from one another, as discussed above, where the shape of the top electrode 840 is the reference apodization and the shape of the outer frame 860 is the secondary apodization, for example. Accordingly, even though the wing 870 has a non-apodized shape, each of the acoustic resonators 800A-800D may be treated as having secondary apodization based on the shapes and arrangements of the top electrode 840 in the main membrane region 802 and the outer frame 860 relative to one another.

Each of the acoustic resonators 800A-800D may be an FBAR or an SMR. When the acoustic resonators 800A-800D are FBARs, for example, the corresponding cross-section of each is depicted in FIG. 8B, which is taken along a line A-A' of representative acoustic resonator 800A in FIG. 8A, for example. When the acoustic resonators 800A-800D are SMRs, for example, the corresponding cross-section of each is depicted in FIG. 8C, which is taken along the line A-A' of representative acoustic resonator 800A, for example.

Referring to FIG. 8B, the acoustic resonator 800A includes a substrate 110 defining an air cavity 115, a bottom (first) electrode 120 disposed on the substrate 110 and air cavity 115, a planarization layer 125 disposed adjacent to bottom electrode 120 on the substrate 110, a piezoelectric layer 130 disposed on the bottom electrode 120 and the planarization layer 125, and a top (second) electrode 340 disposed on the piezoelectric layer 130. Collectively, the bottom electrode 120, the piezoelectric layer 130, and the top electrode 840 constitute an acoustic stack of the acoustic resonator 800A. Also, an overlap among the bottom electrode 120, the piezoelectric layer 130 and a portion of the top electrode 840 in contact with the piezoelectric layer 130 over the air cavity 115 defines a main membrane region 802 of the acoustic resonator 800A. Dotted vertical lines indicate the boundary of the main membrane region 802.

Referring to FIG. 8C, the acoustic resonator 800A (in the alternative) includes the substrate 110, an acoustic reflector 116 disposed on the substrate 110, the bottom (first) electrode 120 disposed on the acoustic reflector 116, the planarization layer 125 disposed adjacent to bottom electrode 120 on the acoustic reflector 116, and the piezoelectric layer 130 disposed on the bottom electrode 120 and the planarization layer 125, and the top (second) electrode 840 disposed on the piezoelectric layer 130. The acoustic reflector 116 may be an acoustic mirror, such as a DBR. The acoustic reflector 116 includes multiple pairs of acoustic reflector layer pairs, indicated by representative first acoustic reflector layer pair 117, second acoustic reflector layer pair 118, and third acoustic reflector layer pair 119, sequentially stacked on the substrate 110, as discussed above. Collectively, the bottom electrode 120, the piezoelectric layer 130, and the top electrode 840 constitute an acoustic stack of the acoustic resonator 800A. Also, an overlap among the bottom electrode 120, the piezoelectric layer 130 and a portion of the top electrode 840 in contact with the piezoelectric layer 130 over the acoustic reflector 116 defines a main membrane region 802 of the acoustic resonator 800A. Dotted vertical lines indicate the boundary of the main membrane region 802.

In both FIGS. 8B and 8C, the acoustic resonator 800A further includes representative lateral performance enhancement features, indicated as the outer frame 860 formed on the top electrode 840 in an outer region of the main membrane region 802 (e.g., around an outer perimeter region of the top electrode 840 in the main membrane region 802), and the wing 870 formed around an outer perimeter of the outer frame 860. The wing 870 creates an air-gap, referred to as air-ring 871, between the wing 870 and the piezoelectric layer 130 that surrounds the outside perimeter of the top electrode 840 in the main membrane region 802. The outer frame 860 has inner edges that define a boundary of an active region 808 formed within the main membrane region 802. The outer edges of the outer frame 860 may coincide with the outer edges of the top electrode 840. The outer edges of the outer frame 860 also may coincide with the inner edges of the wing 870.

Figure 9:
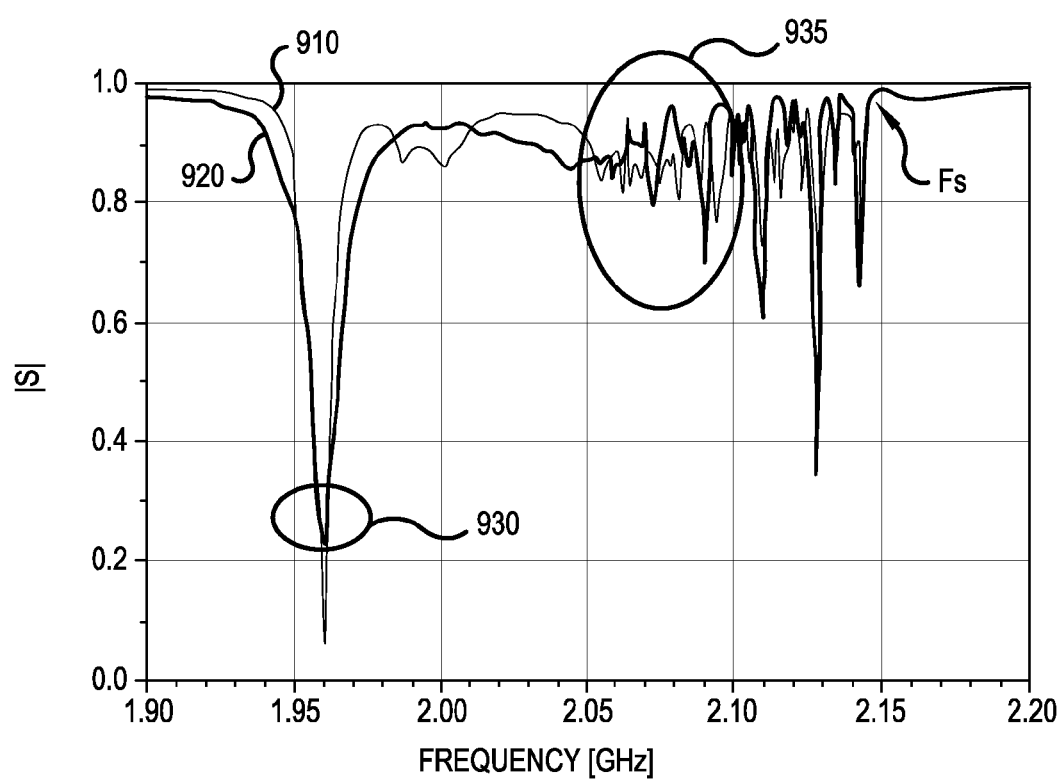
FIG. 9 is a graph showing numerically calculated magnitudes of S-parameters for secondary apodization of an outer frame of an acoustic resonator device having a substantially square outer perimeter, according to a representative embodiment.

FIG. 9 is a graph showing numerically calculated magnitudes of S-parameters for secondary apodization of a wing of an acoustic resonator device, as shown in FIG. 8B, according to a representative embodiment.

Referring to FIG. 9, the x-axis indicates frequency of an applied electrical signal (GHz), and the y-axis indicates magnitudes of S-parameters |S| (arbitrary units). The acoustic resonator device from which the graph shown in FIG. 9 is derived is substantially the same as the acoustic resonator 800A, as shown in FIGS. 8A and 8B, with a substantially square outer perimeter (i.e., outer edges of the wing 870) and apodized top electrode 840 in the main membrane region 802 and outer frame 860, where the outer edges of the wing 870 provide secondary apodization. The outer frame is approximately 5.25 µm in width, and the wing is approximately 3.5 µm in width. Notably, for the acoustic resonator 800A with secondary apodized outer edge of the wing 870 the average wing is approximately 3.5 µm in width.

Plot 910 shows the magnitudes of the S-parameters |S| as a function of frequency of electrical signal applied to an acoustic resonator device with a top electrode, an outer frame and a wing having the same substantially square shape. Plot 920 shows the magnitudes of the S-parameters |S| as a function of frequency of the acoustic resonator device (e.g., 800A) with an apodized top electrode in the main membrane region, secondary apodization of the wing, and a substantially square outer frame, as discussed above. By comparing plots 910 and 920, it is apparent that the secondary apodization of the wing suppresses resonance of the outer frame at about 1.96 GHz, indicated by circle 930, and suppresses rattles in the 2.05-2.10 GHz range (e.g., southwest rattles in a Smith-chart polar plot), indicated by circle 935. The series resonance frequency Fs frequency of the acoustic resonator device is approximately 2.14 GHz. Notably, due to the primary non-apodized (square) geometry of the top electrode, the rattles in the sub-Fs frequency region exhibit a very periodic pattern as a function of frequency with strong resonances at selected frequencies, as evident from plot 910. Both the primary apodization of the top electrode shape and secondary apodization of the wing may reduce the strength of these resonances and may somewhat remove resonance periodicity, as evident from plot 610 of FIG. 6 and plot 920 of FIG. 9, respectively.

Generally, frames and wings can be placed in various alternative locations and configurations relative to other portions of an acoustic resonator, such as the electrodes and piezoelectric layer of an acoustic stack. Additionally, their dimensions, materials, relative positioning, and so on, can be adjusted to achieve specific design objectives, such as a target resonant frequency, series resistance Rs, parallel resistance Rp, or electromechanical coupling coefficient $Kt^2$. Although the above description presents several embodiments in the form of FBAR devices and SMR devices, several of the described concepts could be implemented in other forms of acoustic resonators, without departing from the scope of the present teachings.

While example embodiments are disclosed herein, one of ordinary skill in the art appreciates that many variations that are in accordance with the present teachings are possible and remain within the scope of the appended claims. For instance, as indicated above, the location, dimensions, materials and even numbers of frames can be variously altered. In addition, other features can be added and/or removed to further improve various performance characteristics of the described devices. These and other variations would become clear to one of ordinary skill in the art after inspection of the specification, drawings and claims herein. The invention therefore is not to be restricted except within the spirit and scope of the appended claims.

The invention claimed is:

1. An acoustic resonator device, comprising:
   a bottom electrode disposed on a substrate over an acoustic reflecting feature;
   a piezoelectric layer disposed on the bottom electrode;
   a top electrode disposed on the piezoelectric layer, an overlap between the bottom electrode, the piezoelectric layer and a portion of the top electrode in contact with the piezoelectric layer, stacked over the acoustic reflecting feature, defining a main membrane region of the acoustic resonator device; and
   at least one of a wing having outer edges extending beyond an outer boundary of the main membrane region, and a first frame formed on the top electrode in an outer region of the main membrane region,
   wherein inner edges of the at least one of the wing and of the first frame provide an apodized polygon shape, such that none of the inner edges are parallel to one another, the apodized polygon shape of the at least one of the wing and the first frame being different from an electrode shape defined by the outer boundary of the main membrane region.

2. The acoustic resonator device of claim 1, wherein the electrode shape is an apodized polygon.

3. The acoustic resonator device of claim 1, wherein the outer edges of the wing are substantially rectangular, enabling higher packaging density with respect to other acoustic resonator devices having substantially rectangular wings in an RF filter device comprising acoustic resonator devices of claim 1.

4. The acoustic resonator device of claim 1, wherein the wing has an apodized polygon shape and the first frame has a non-apodized shape, such that at least two edges of the first frame that define the first frame are parallel to one another.

5. The acoustic resonator device of claim 1, wherein the first frame has an apodized polygon shape and the wing has a non-apodized shape, such that at least two edges of the wing that define the wing are parallel to one another.

6. The acoustic resonator device of claim 1, wherein both the wing and the first frame have corresponding apodized polygon shapes different from one another.

7. The acoustic resonator device of claim 1, wherein an outermost perimeter of the acoustic resonator device has a substantially rectangular shape, enabling higher packaging density with respect to other acoustic resonator devices having substantially rectangular shaped outermost perimeters in an RF filter device comprising acoustic resonator devices of claim 1.

8. The acoustic resonator device of claim 1, further comprising:
a second frame formed in a center region of the main membrane region, the apodized polygon shape of the at least one of the wing and the first frame being different from a shape of the second frame.

9. The acoustic resonator device of claim 8, wherein the shape of the second frame is an apodized polygon shape.

10. The acoustic resonator device of claim 8, wherein each of the first frame and the second frame comprises an add-on frame.

11. The acoustic resonator device of claim 8, wherein each of the first frame and the second frame comprises a composite frame.

12. The acoustic resonator device of claim 8, wherein the shape of the wing and the shape of the second frame are the same as one another.

13. The acoustic resonator device of claim 8, wherein the shape of the wing and the shape of the second frame Are different from one another.

14. The acoustic resonator device of claim 1, wherein the apodized polygon shape of the at least one of the wing and the first frame is obtained by translating at least one vertex of the respective shape according to a corresponding vector in relation to a reference shape.

15. The acoustic resonator device of claim 1, wherein the apodized polygon shape of the at least one of the wing and the first frame is obtained by rotating the respective polygon shape according to a predetermined angle in relation to a reference shape.

16. The acoustic resonator device of claim 1, wherein the acoustic reflecting feature comprises a cavity formed in the substrate.

17. The acoustic resonator device of claim 1, wherein the acoustic reflecting feature comprises a distributed Bragg reflector (DBR) formed on the substrate between the substrate and the bottom electrode.

18. An acoustic resonator device, comprising:
a bottom electrode disposed on a substrate over an acoustic reflecting feature;
a piezoelectric layer disposed on the bottom electrode;
a top electrode disposed on the piezoelectric layer, an overlap between the bottom electrode, the piezoelectric layer and a portion of the top electrode in contact with the piezoelectric layer, stacked over the acoustic reflecting feature, defining a main membrane region of the acoustic resonator device; and
a wing having outer edges extending beyond at least a portion of an outer boundary of the main membrane region,
wherein the wing has an apodized polygon shape, such that no edges of the wing are parallel to one another, the apodized polygon shape being different from an electrode shape defined by the outer boundary of the main membrane region.

19. An acoustic resonator device, comprising:
a bottom electrode disposed on a substrate over an acoustic reflecting feature;
a piezoelectric layer disposed on the bottom electrode;
a top electrode disposed on the piezoelectric layer, an overlap between the bottom electrode, the piezoelectric layer and a portion of the top electrode in contact with the piezoelectric layer, stacked over the acoustic reflecting feature, defining a main membrane region of the acoustic resonator device;
an outer frame formed on the top electrode in an outer region of the main membrane region, the outer frame having a first apodized polygon shape; and
a wing having outer edges extending beyond at least a portion of an outer boundary of the main membrane region, the wing having a second apodized polygon shape different from the first apodized polygon shape.

20. The acoustic resonator device of claim 19, further comprising:
an inner frame formed on the top electrode in a center region of the main membrane region, the inner frame having a third apodized polygon shape different from at least one of the first and second apodized polygon shapes.

* * * * *